United States Patent
Zhu

(10) Patent No.: US 11,195,765 B2
(45) Date of Patent: Dec. 7, 2021

(54) SEMICONDUCTOR DEVICE INCLUDING STRESSED SOURCE/DRAIN, METHOD OF MANUFACTURING THE SAME AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/338,169

(22) PCT Filed: Jul. 31, 2017

(86) PCT No.: PCT/CN2017/095130
§ 371 (c)(1),
(2) Date: Mar. 29, 2019

(87) PCT Pub. No.: WO2018/059108
PCT Pub. Date: Apr. 5, 2018

(65) Prior Publication Data
US 2019/0279980 A1    Sep. 12, 2019

(30) Foreign Application Priority Data

Sep. 30, 2016 (CN) .......................... 201610872541.2
Jun. 30, 2017 (CN) .......................... 201710530297.6

(51) Int. Cl.
H01L 21/8238    (2006.01)
H01L 21/8234    (2006.01)
(Continued)

(52) U.S. Cl.
CPC ...... *H01L 21/823885* (2013.01); *B82Y 10/00* (2013.01); *G05B 23/0216* (2013.01);
(Continued)

(58) Field of Classification Search
CPC combination set(s) only.
See application file for complete search history.

(56) References Cited

U.S. PATENT DOCUMENTS 5,554,870 A     9/1996  Fitch et al.
6,943,407 B2    9/2005  Ouyang et al.
(Continued)

FOREIGN PATENT DOCUMENTS

CN    1901225     1/2007
CN    102299154   12/2011
(Continued)

OTHER PUBLICATIONS

First Office Action, issued in the corresponding Chinese patent application No. 201710530685.4, dated Aug. 28, 2019, 7 pages.
(Continued)

*Primary Examiner* — Nduka E Ojeh
(74) *Attorney, Agent, or Firm* — Hamre, Schumann, Mueller & Larson, P.C.

(57) ABSTRACT

There are provided a semiconductor device, a method of manufacturing the same, and an electronic device including the device. According to an embodiment, the semiconductor device may include a substrate, and a first device and a second device formed on the substrate. Each of the first device and the second device includes a first source/drain layer, a channel layer and a second source/drain layer stacked on the substrate in sequence, and also a gate stack surrounding a periphery of the channel layer. The channel layer of the first device and the channel layer of the second device are substantially co-planar with each other, and the
(Continued)

respective second source/drain layers of the first device and the second device are stressed differently.

33 Claims, 22 Drawing Sheets

(51) Int. Cl.

| | |
|---|---|
| H01L 29/06 | (2006.01) |
| H01L 29/267 | (2006.01) |
| H01L 29/417 | (2006.01) |
| H01L 29/66 | (2006.01) |
| H01L 29/775 | (2006.01) |
| H01L 29/786 | (2006.01) |
| H01L 29/10 | (2006.01) |
| H01L 29/78 | (2006.01) |
| H01L 21/02 | (2006.01) |
| H01L 21/3065 | (2006.01) |
| H01L 29/04 | (2006.01) |
| H01L 29/165 | (2006.01) |
| H01L 29/423 | (2006.01) |
| B82Y 10/00 | (2011.01) |
| G05B 23/02 | (2006.01) |
| G06T 19/00 | (2011.01) |
| H04N 5/232 | (2006.01) |
| H04N 7/18 | (2006.01) |
| H01L 21/225 | (2006.01) |
| H01L 21/324 | (2006.01) |
| H01L 29/08 | (2006.01) |
| H01L 29/15 | (2006.01) |
| H01L 29/205 | (2006.01) |
| H01L 29/45 | (2006.01) |
| H01L 29/778 | (2006.01) |
| H01L 21/308 | (2006.01) |
| H01L 21/822 | (2006.01) |
| H01L 27/092 | (2006.01) |
| H04N 13/332 | (2018.01) |
| H04N 13/111 | (2018.01) |
| H04N 13/366 | (2018.01) |
| H04N 13/398 | (2018.01) |
| G06F 3/0481 | (2013.01) |
| G06F 3/0482 | (2013.01) |
| G06K 9/00 | (2006.01) |
| H04N 5/247 | (2006.01) |
| H01L 21/3105 | (2006.01) |

(52) U.S. Cl.
CPC ...... *G06T 19/006* (2013.01); *H01L 21/02532* (2013.01); *H01L 21/02636* (2013.01); *H01L 21/2252* (2013.01); *H01L 21/2258* (2013.01); *H01L 21/3065* (2013.01); *H01L 21/3083* (2013.01); *H01L 21/324* (2013.01); *H01L 21/8221* (2013.01); *H01L 21/82345* (2013.01); *H01L 21/823412* (2013.01); *H01L 21/823418* (2013.01); *H01L 21/823475* (2013.01); *H01L 21/823487* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 27/092* (2013.01); *H01L 29/04* (2013.01); *H01L 29/0638* (2013.01); *H01L 29/0653* (2013.01); *H01L 29/0676* (2013.01); *H01L 29/0847* (2013.01); *H01L 29/1037* (2013.01); *H01L 29/1054* (2013.01); *H01L 29/1083* (2013.01); *H01L 29/1095* (2013.01); *H01L 29/152* (2013.01); *H01L 29/165* (2013.01); *H01L 29/205* (2013.01); *H01L 29/267* (2013.01); *H01L 29/41741* (2013.01); *H01L 29/42376* (2013.01); *H01L 29/42392* (2013.01); *H01L 29/45* (2013.01); *H01L 29/6656* (2013.01); *H01L 29/66431* (2013.01); *H01L 29/66439* (2013.01); *H01L 29/66462* (2013.01); *H01L 29/66469* (2013.01); *H01L 29/66522* (2013.01); *H01L 29/66666* (2013.01); *H01L 29/66712* (2013.01); *H01L 29/66742* (2013.01); *H01L 29/775* (2013.01); *H01L 29/7788* (2013.01); *H01L 29/7813* (2013.01); *H01L 29/7827* (2013.01); *H01L 29/7848* (2013.01); *H01L 29/78642* (2013.01); *H04N 5/23238* (2013.01); *H04N 7/181* (2013.01); *G05B 2219/32014* (2013.01); *G06F 3/0482* (2013.01); *G06F 3/04817* (2013.01); *G06K 9/00711* (2013.01); *G06K 2009/00738* (2013.01); *G06K 2209/19* (2013.01); *H01L 21/31053* (2013.01); *H01L 29/0649* (2013.01); *H04N 5/247* (2013.01); *H04N 13/111* (2018.05); *H04N 13/332* (2018.05); *H04N 13/366* (2018.05); *H04N 13/398* (2018.05)

(56) References Cited

U.S. PATENT DOCUMENTS

| | | |
|---|---|---|
| 9,196,730 B1 | 11/2015 | Yu et al. |
| 9,214,235 B2 | 12/2015 | Rhie |
| 9,251,888 B1 | 2/2016 | Liaw |
| 9,685,537 B1 | 6/2017 | Xie et al. |
| 2003/0116792 A1* | 6/2003 | Chen ............... H01L 29/1054 257/220 |
| 2004/0157353 A1 | 8/2004 | Ouyang et al. |
| 2006/0226495 A1* | 10/2006 | Kwon ............. H01L 21/823807 257/371 |
| 2006/0255330 A1 | 11/2006 | Chen et al. |
| 2008/0067607 A1 | 3/2008 | Verhulst et al. |
| 2010/0327319 A1 | 12/2010 | Iacopi et al. |
| 2013/0082333 A1* | 4/2013 | Chen ............... H01L 27/0886 257/401 |
| 2015/0017767 A1 | 1/2015 | Masuoka et al. |
| 2015/0200288 A1 | 7/2015 | Zhang et al. |
| 2015/0380555 A1* | 12/2015 | Ohtou .................... B82Y 10/00 257/329 |
| 2016/0049397 A1* | 2/2016 | Chang ............... H01L 23/485 257/329 |
| 2016/0064541 A1 | 3/2016 | Diaz et al. |
| 2016/0204251 A1 | 7/2016 | Masuoka et al. |
| 2016/0211368 A1 | 7/2016 | Chen et al. |
| 2016/0268256 A1 | 9/2016 | Yang et al. |
| 2016/0293739 A1 | 10/2016 | Zhang |
| 2016/0315084 A1* | 10/2016 | Wu ................... H01L 27/0924 |
| 2016/0372316 A1* | 12/2016 | Yang ................. H01L 27/1211 |
| 2017/0077231 A1* | 3/2017 | Balakrishnan ...... H01L 29/7842 |
| 2017/0170196 A1 | 6/2017 | Anderson et al. |
| 2017/0194318 A1* | 7/2017 | Balakrishnan ........ H01L 29/861 |
| 2017/0345927 A1* | 11/2017 | Cantoro ............. H01L 29/7827 |
| 2018/0047832 A1 | 2/2018 | Tapily et al. |
| 2018/0254322 A1* | 9/2018 | Cheng ................. H01L 27/088 |
| 2020/0118890 A1* | 4/2020 | Bao ..................... H01L 29/4966 |

FOREIGN PATENT DOCUMENTS

| | | |
|---|---|---|
| CN | 104022121 A | 9/2014 |
| CN | 104103515 | 10/2014 |
| CN | 105280705 A | 1/2016 |
| CN | 106298778 | 1/2017 |

OTHER PUBLICATIONS

U.S. Non-final Office Action, issued in the corresponding U.S. Appl. No. 15/720,913, dated Dec. 27, 2018, 10 pages.

(56) References Cited

OTHER PUBLICATIONS

International Search Report and Written Opinion, International Patent Application No. PCT/CN2017/095124, dated Nov. 9, 2017, with English translation (20 pages).
International Search Report, issued in the corresponding PCT application No. PCT/CN2017/095130, dated Oct. 13, 2017, 6 pages.
Second Chinese Office Action, issued in the corresponding Chinese patent application No. 201710530685.4, dated Apr. 15, 2020, 10 pages.
Non-final Office Action, issued in the related U.S. Appl. No. 16/337,882, dated Mar. 1, 2021, 38 pages.
Non-Final Office Action, issued in the related U.S. Appl. No. 16/860,707, dated May 24, 2021, 10 pages.

* cited by examiner

SEMICONDUCTOR DEVICE INCLUDING STRESSED SOURCE/DRAIN, METHOD OF MANUFACTURING THE SAME AND ELECTRONIC DEVICE INCLUDING THE SAME

CROSS-REFERENCE TO RELATED APPLICATION(S)

This application claims priority to Chinese Patent Application No. 201610872541.2, filed on Sep. 30, 2016, entitled "SEMICONDUCTOR DEVICE, METHOD OF MANUFACTURING THE SAME, AND ELECTRONIC DEVICE INCLUDING THE DEVICE," and Chinese Patent Application No. 201710530297.6, filed on Jun. 30, 2017, entitled "SEMICONDUCTOR DEVICE, METHOD OF MANUFACTURING THE SAME, AND ELECTRONIC DEVICE INCLUDING THE DEVICE," which are incorporated herein by reference in their entireties.

TECHNICAL FIELD

The present disclosure relates generally to the semiconductor field, and more particularly, to a vertical semiconductor device, a method of manufacturing the same, and an electronic device including the semiconductor device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, it is generally required to reduce an area occupied by the source, the drain and the gate so as to scale down a footprint of the planar device, which may deteriorate performances of the device (for example, increased power consumption and resistance). Therefore, the area of the planar device is difficult to be further scaled down. In contrast, in a vertical device, a source, a gate and a drain are arranged in a direction substantially perpendicular to a substrate surface. As a result, a footprint of the vertical device is easier to be scaled down compared to the planar device.

SUMMARY

In view of the above, the present disclosure aims to provide, among others, a vertical semiconductor device with improved characteristics, a method of manufacturing the same, and an electronic device including the semiconductor device.

According to an aspect of the present disclosure, there is provided a semiconductor device, comprising a substrate, and a first device and a second device formed on the substrate. Each of the first device and the second device comprises a first source/drain layer, a channel layer and a second source/drain layer stacked on the substrate in sequence, and a gate stack surrounding a periphery of the channel layer. The channel layer of the first device and the channel layer of the second device are substantially coplanar with each other, and the respective second source/drain layers of the first device and the second device are stressed differently.

According to a further aspect of the present disclosure, there is provided a method of manufacturing a semiconductor device, comprising: disposing a stack of a first source/drain layer, a channel layer, and a second source/drain layer on a substrate; defining an active region for a first device and an active region for a second device, respectively, from the first source/drain layer, the channel layer and the second source/drain layer which are stacked; forming gate stacks for the respective first and second devices to surround peripherals of the respective channel layers in the respective active regions for the first device and the second device; and introducing different stress into the respective second source/drain layers of the first device and the second device.

According to a further aspect of the present disclosure, there is provided an electronic device comprising an Integrated Circuit (IC) comprising the above described semiconductor device.

According to embodiments of the present disclosure, the respective second source/drain layers of the first device and the second device may be stressed differently, so that separate stress engineering is provided for the first device and the second device, respectively. For example, this can be done by introducing a stressed material into the second source/drain layer. Thus, it is possible to create stress in the channel, to further improve the device performances.

Further, the gate stack surrounds the periphery of the channel layer and the channel is formed in the channel layer. Thus, the gate length is determined substantially by the thickness of the channel layer. The channel layer may be formed by, for example, epitaxy, and thus the thickness thereof can be well controlled. Therefore, the gate length can be well controlled. The vertical devices formed in different regions on the substrate may have different gate lengths. The periphery of the channel layer may be recessed inwards with respect to that of the first source/drain layer and the second source/drain layer, so that the gate stack can be embedded into the recess, to reduce or even avoid overlap with the source/drain, which contributes to reduced parasitic capacitance between the gate and the source/drain. Further, the channel layer may comprise a single-crystalline semiconductor material, resulting in improved carrier mobility and lower current leakage and thus enhanced device performances.

BRIEF DESCRIPTION OF THE DRAWINGS

The above and other objects, features, and advantages of the present disclosure will become more apparent from following descriptions of embodiments thereof with reference to attached drawings, in which.

DETAILED DESCRIPTION

Figure 1:
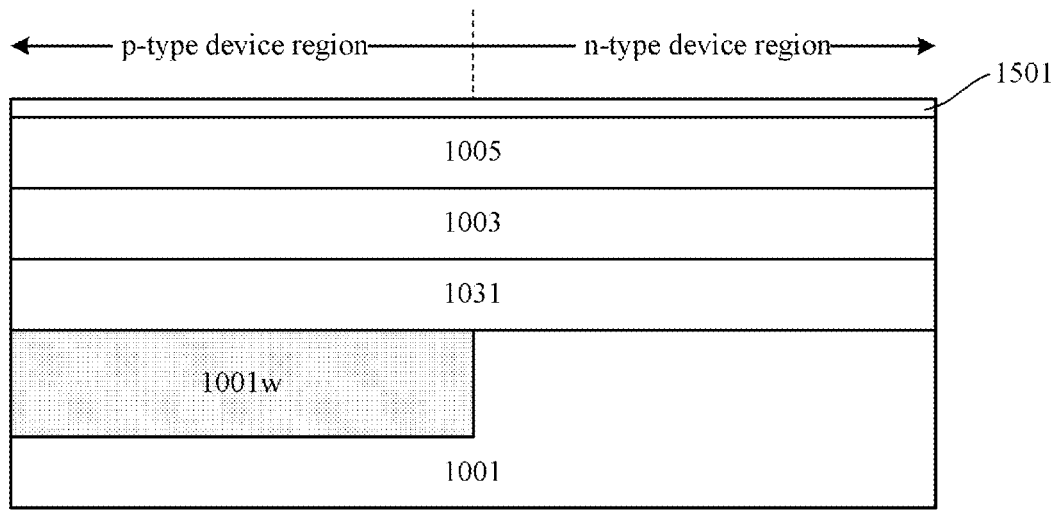
FIGS. 1 to 26 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A vertical semiconductor device according to embodiments of the present disclosure may include a first source/drain layer, a channel layer and a second source/drain layer stacked on a substrate in sequence. The respective layers may be contiguous to each other, or may have another semiconductor layer interposed therebetween, for example, a leakage suppression layer and/or an ON current enhancement layer (i.e., a semiconductor layer having a band gap greater than or less than that of adjacent layers). Source/drain regions of the device may be formed in the first source/drain layer and the second source/drain layer, while a channel region of the device may be formed in the channel layer. A conductive channel may be formed by the channel region between the source/drain regions on opposite sides of the channel region.

A gate stack may be formed to surround a periphery of the channel layer. As a result, a gate length may be determined substantially by the thickness of the channel layer itself, rather than depending on etching timing as in the conventional art. The channel layer may be formed by, for example, epitaxy, and thus the thickness thereof can be well controlled. Therefore, the gate length can be well controlled.

The respective channel layers of devices in different device regions on the substrate may be substantially co-planar with each other, for example, they may extend in a plane substantially parallel to a surface of the substrate. In an example, upper surfaces and/or lower surfaces of the channel layers in the respective device regions may be substantially co-planar. Thus, the channel layers in the respective device regions may have different thicknesses, and accordingly may result in different channel lengths.

The channel layer may have its periphery recessed to that of the first source/drain layer and the second source/drain layer. Then, the resultant gate stack may be embedded into a recess of the channel layer with respect to the first source/drain layer and the second source/drain layer. Preferably, an extent of the gate stack in a stack direction (a vertical direction, for example, approximately perpendicular to the substrate surface) of the first source/drain layer, the channel layer and the second source/drain layer is within an extent of the recess in that direction. Thereby, overlap with the source/drain regions can be reduced or even avoided, thus contributing to reduced parasitic capacitance between the gate and the source/drain.

In a case that a first device and a second device are of different conductivity types (for example, the first device is an n-type device and the second device is a p-type device), the gate stack, particularly, a gate conductor layer therein, may need to be formed differently for the first device and the second device (for example, the gate conductor layers of the n-type device and the p-type device are formed using gate conductor materials with different work functions, respectively). For example, the first device and the second device may comprise corresponding gate conductor materials with suitable work functions and embedded into corresponding recesses.

In addition, for convenience of making an electrical contact to the gate conductor layer, a gate contact pad leading from the gate conductor layer may also be included. The gate contact pad may be in electrical contact with the gate stack (specifically, the gate conductor layer), and extend in a direction away from the channel layer (for example, extend beyond the periphery of the active region). Advantageously, for convenience of manufacture, the gate contact pad may be formed from the gate conductor layer of one (for example, the first device) of the first device and the second device, even for the other device (for example, the second device). For example, the gate conductor layer of the one device (for example, the first device) may extend outwards from the corresponding recess to act as the gate contact pad for this device, and in addition, another portion of the gate conductor layer may extend to the gate conductor layer of the other device (for example, the second device) to act as the gate contact pad for the other device.

According to an embodiment of the present disclosure, different stress engineering may be performed respectively on the first device and the second device to introduce different stress into the respective second source/drain layers of the first device and the second device. The stress engineering may include strained sources/drains, stressed liners, stress memory, or the like. For example, at least one of the respective second source/drain layers of the first device and the second device may include a stressed semiconductor material (which may be referred to as a "first semiconductor material") to create stress in the channel layer. The stressed semiconductor material may abut the channel layer, or there may be an intermediate layer (for example, a seed layer for growing the stressed semiconductor layer, which may be referred to as a "second semiconductor material") between the stressed semiconductor layer and the channel layer. The stressed first semiconductor material may create stress along a current flow direction (here, a vertical direction) in the device. For the first device and the second device, particularly in a case where the first device and the second device have different conductivity types, the respective second source/drain layers of the first device and the second device may be stressed oppositely. For example, for a p-type device, the stressed semiconductor material may create compressive stress along the current flow direction in the channel layer; and for an n-type device, the stressed semiconductor material may create tensile stress along the current flow direction in the channel layer. For example, the first semiconductor material may have a lattice constant greater than that of the second semiconductor material if without being stressed, so as to create the compressive stress in the channel layer (particularly for the p-type device); or the first semiconductor material may have a lattice constant less than that of the second semiconductor material if without being stressed, so as to create the tensile stress in the channel layer (particularly for the n-type device). For example, for the p-type device, the first semiconductor material comprises first SiGe, the second semiconductor material comprises second SiGe, and the first SiGe has a concentration of Ge greater than that in the second SiGe. Alternatively, for the n-type device, the first semiconductor material comprises first SiGe, the second semiconductor material comprises second SiGe, and the first SiGe has a concentration of Ge less than that in the second SiGe.

The channel layer may be made of a single-crystalline semiconductor material to improve device performances. Certainly, the first source/drain layer and the second source/drain layer may also be made of a single-crystalline semiconductor material. In this case, the single-crystalline semiconductor material of the channel layer and the single-crystalline semiconductor material of the source/drain layers may be eutectic. Mobility of electrons or holes in the single-crystalline semiconductor material of the channel layer may be greater than that in the first source/drain layer and the second source/drain layer (particularly, portions of the first source/drain layer and the second source/drain layer adjacent to the channel layer, for example, the above mentioned intermediate layer). Further, a forbidden band gap of the first source/drain layer and the second source/drain layer (particularly, portions of the first source/drain layer and the second source/drain layer adjacent to the channel layer, for example, the above mentioned intermediate layer) may be greater than that of the single-crystalline semiconductor material of the channel layer.

According to embodiments of the present disclosure, the single-crystalline semiconductor material of the channel layer may have the same crystal structure as that of the first source/drain layer and the second source/drain layer (particularly, portions of the first source/drain layer and the second source/drain layer adjacent to the channel layer, for example, the above mentioned intermediate layer). In this case, a lattice constant of the first source/drain layer and the second source/drain layer (particularly, portions of the first source/drain layer and the second source/drain layer adjacent to the channel layer, for example, the above mentioned intermediate layer) if without being strained may be greater than that of the single-crystalline semiconductor material of the channel layer if without being strained. Then, the mobility of holes in the single-crystalline semiconductor material of the channel layer may be greater than that if without being strained, or an effective mass of light holes in the single-crystalline semiconductor material of the channel layer may be less than that if without being strained, or a concentration of light holes in the single-crystalline semiconductor material of the channel layer may be greater than that if without being strained. Alternatively, the lattice constant of the first source/drain layer and the second source/drain layer (particularly, portions of the first source/drain layer and the second source/drain layer adjacent to the channel layer, for example, the above mentioned intermediate layer) if without being strained may be less than the lattice constant of the single-crystalline semiconductor material of the channel layer if without being strained. Then, the mobility of electrons in the single-crystalline semiconductor material of the channel layer may be greater than that if without being strained, or an effective mass of electrons in the single-crystalline semiconductor material of the channel layer may be less than that if without being strained.

According to embodiments of the present disclosure, doping of the source/drain regions may move partially into end portions of the channel layer close to the first source/drain layer and the second source/drain layer. As a result, there may be a doping distribution in the end portions of the channel layer close to the first source/drain layer and the second source/drain layer, while helps reducing resistance between the source/drain region and the channel region when the device is ON and thus improving the device performances.

According to embodiments of the present disclosure, the channel layer may comprise a semiconductor material different from that of the first source/drain layer and the second source/drain layer (particularly, portions of the first source/drain layer and the second source/drain layer adjunct to the channel layer, for example, the above mentioned intermediate layer). Thus, it facilitates processing the channel layer by, for example, selective etching, to recess the channel layer with respect to the first source/drain layer and the second source/drain layer. Further, the first source/drain layer and the second source/drain layer (particularly, portions of the first source/drain layer and the second source/drain layer adjacent to the channel layer, for example, the above mentioned intermediate layer) may comprise the same semiconductor material as each other.

The respective layers in the active region may be formed by epitaxy, so that thicknesses thereof can be controlled accurately. For example, the first source/drain layer may be a semiconductor layer epitaxially grown on the substrate, the channel layer may be a semiconductor layer epitaxially grown on the first source/drain layer, and the second source/drain layer may be a semiconductor layer epitaxially grown on the channel layer.

According to embodiments of the present disclosure, liners may be disposed on surfaces of the first and second source/drain layers of the respective first and second devices. The liners may even be stressed. For example, for an n-type device, the stressed liner may be compressive stressed to create tensile stress in the channel layer; and for a p-type device, the stressed liner may be tensile stressed to create compressive stress in the channel layer. As a result, the device performances can be further improved.

According to embodiments of the present disclosure, the first device and the second device may be of different conductivity types, and therefore may be configured as Complementary Metal Oxide Semiconductor (CMOS).

Such a semiconductor device may be manufactured as follows. Specifically, a stack of a first source/drain layer, a channel layer, and a second source/drain layer may be disposed on a substrate. The first source/drain layer may be provided by the substrate itself or by epitaxial growth on the substrate. Next, the channel layer may be epitaxially grown on the first source/drain layer, and the second source/drain layer may be epitaxially grown on the channel layer. The channel layer may have its thickness well controlled in the epitaxy process. Since the respective layers are epitaxially grown respectively, there may be a clear crystalline interface between at least a pair of adjacent ones of those layers. Further, the respective layers may be differently doped respectively, and then there may be a doping concentration interface between at least a pair of adjacent ones of those layers. The channel layer may be processed to have different thicknesses in a first device region and a second device region. For example, after the growth of the channel layer, a portion of the channel layer in one of the device regions may be thinned (for example, by etching), or the channel layer may be further grown (i.e., thickened) in one of the device regions. Or alternatively, after the growth of the first source/drain layer, a portion of the first source/drain layer in one of the device regions may be thinned (for example, by etching) and then the channel layer is grown thereon.

For the first source/drain layer, the channel layer and the second source/drain layer which are stacked, active regions may be defined for a first device and a second device in the first device region and the second device region, respectively. For example, those layers may be selectively etched in sequence into a desired shape. The respective active regions of the first device and the second device may be obtained from the same first source/drain layer, channel layer and second source/drain layer. Generally, the active region may have a pillar shape (for example, a cylindrical shape). The etching of the first source/drain layer may be performed with respect to only an upper portion of first source/drain layer, so that a lower portion of the first source/drain layer may extend beyond a periphery of the upper portion, for convenience of making connection to a source/drain region formed in the first source/drain layer in subsequent processes. Then, gate stacks may be formed to surround peripheries of the respective channel layers.

Further, the periphery of the channel layer may be recessed with respect to peripheries of the first source/drain layer and the second source/drain layer, to define spaces for receiving the respective gate stacks. For example, this can be done by selective etching. In this case, the gate stacks may be embedded into the respective recesses.

Source/drain regions may be formed in the first source/drain layer and the second source/drain layer. For example, this can be done by doping the first source/drain layer and the second source/drain layer. For example, ion implantation, plasma doping, or the like may be performed. In an advantageous example, sacrificial gates may be formed in the respective recesses of the periphery of the channel layers with respect to the periphery of the first source/drain layer and the second source/drain layer. Then, a dopant source layer may be formed on surfaces of the first source/drain layer and the second source/drain layer, and dopants may be driven by, for example, annealing, from the dopant source layer into the active regions via the first source/drain layer and the second source/drain layer. The sacrificial gates may prevent the dopants from directly moving into the channel layer. However, some of the dopants may move into end portions of the channel layer close to the first source/drain layer and the second source/drain layer through the first source/drain layer and the second source/drain layer. If the first device and the second device are of different conductivity types, they may be doped separately.

The gate stacks for the first device and the second device may be formed in the respective recesses of the channel layers of the first device and the second device, respectively. If the first device and the second device are of different conductivity types and are to be formed with different gate stacks, the gate stacks thereof may be formed sequentially. In forming a later one of the gate stacks, a gate conductor layer in this gate stack can be used to form respective gate contact pads for the first device and the second device. The gate contact pads may be formed by patterning the gate conductor layer.

Here, stress engineering may be further applied to introduce different stress in the respective second source/drain layers of the first device and the second device. For example, the strained source/drain technique may be applied. Specifically, a strained or stressed material may be introduced into the second source/drain layer of at least one of the first device and the second device to create stress in the channel layer. For example, the second source/drain layer may be patterned so that it is at least partially removed and then the stressed semiconductor material may be grown with a remaining portion of the second source/drain layer (in a case where the second source/drain layer is not completely removed) or the channel layer (in a case where the second source/drain layer is completely removed) as a seed.

The technology of the present disclosure can be implemented in various ways, some of which are exemplified in the following with reference to the drawings.

FIGS. 1 to 26 are schematic views showing a flow of manufacturing a semiconductor device according to an embodiment of the present disclosure. In the following description, a scenario where an n-type device and a p-type device are formed respectively is described by way of example to show how devices of different conductivity types are formed in more detail. It should be understood that it is certainly possible to form devices of the same conductivity type.

As shown in FIG. 1, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate, or the like. Hereinafter, the bulk Si substrate will be described by way of example for convenience of description. Here, a p-type silicon wafer is provided as the substrate 1001. In the substrate 1001, an n-type well region 1001w may be formed by, for example, ion implantation. A p-type device may be formed on the n-type well region 1001w (which is thus referred to as a p-type device region), and an n-type device may be formed on another region of the p-type Si substrate 1001 (which is thus referred to as an n-type device region).

On the substrate 1001, a first source/drain layer 1031, a channel layer 1003 and a second source/drain layer 1005 may be formed in sequence by, for example, epitaxy. As an example, the first source/drain layer 1031 may comprise SiGe (with an atomic percentage of Ge being about 10-40%), with a thickness of about 20-50 nm; the channel layer 1003 may comprise Si, with a thickness of about 10-100 nm; the second source/drain layer 1005 may comprise SiGe (with an atomic percentage of Ge being about 10-40%), with a thickness of about 20-50 nm. SiGe has a greater lattice constant than Si, if without being strained.

The materials for the first source/drain layer 1031, the channel layer 1003 and the second source/drain layer 1005 are not limited thereto. Other semiconductor materials are also possible as long as they can provide appropriate etching selectivity. For example, the channel layer 1003 may include Si:C, Ge, or group III-V compound semiconductor materials. Further, the channel layer 1003 may comprise a semiconductor material, with the same components as the first source/drain layer 1031 and the second source/drain layer 1005, but with different contents of the components (for example, they all comprise SiGe, but with different atomic percentages of Ge), as long as the channel layer 1003 has etching selectivity with respect to the underlying first source/drain layer 1031 and the overlying second source/drain layer 1005. Further, the first source/drain layer 1031 and the second source/drain layer 1005 may comprise Si:C (with an atomic percentage of C being about 0.1-5%), while the channel layer 1003 may comprise Si. Si:C has a smaller lattice constant than Si, if without being strained.

A dielectric layer 1501 may be formed by, for example, deposition, on the second source/drain layer 1005. The dielectric layer 1501 may function as a mask, a protection layer, or the like. For example, the dielectric layer 1501 may include nitride, with a thickness of about 10-100 nm.

Figure 2A:
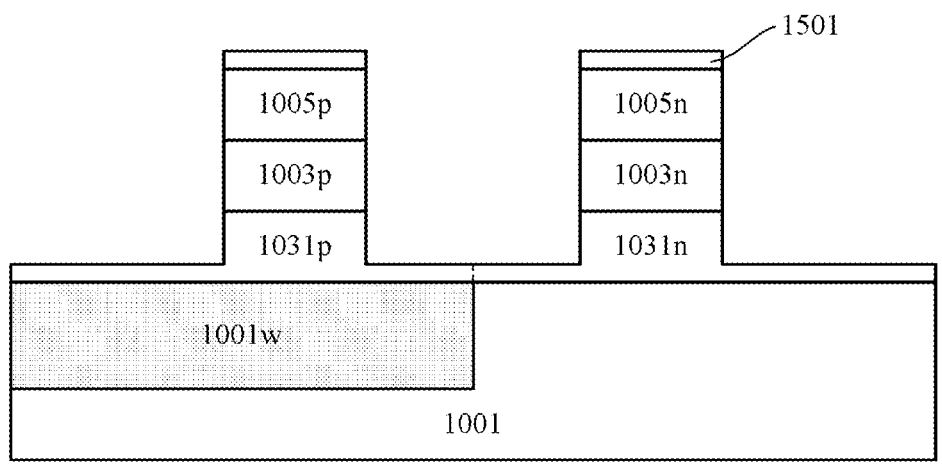
Figure 2B:
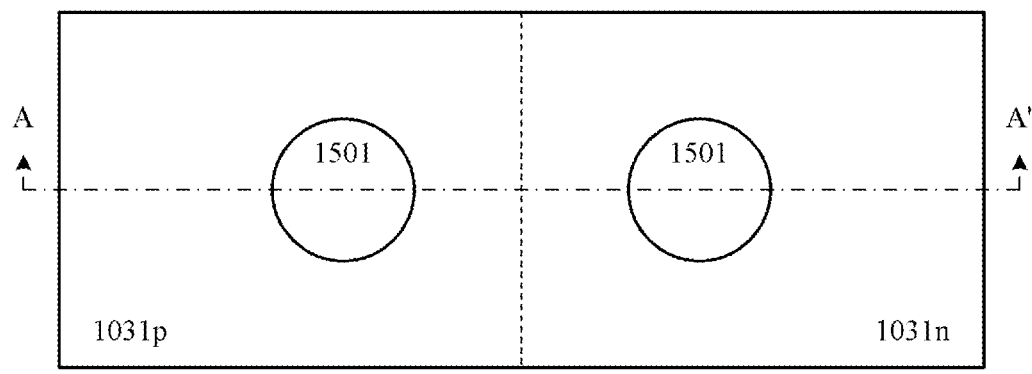

Next, active regions can be defined for the devices. For example, this can be done as follows. Specifically, as shown in FIGS. 2(a) and 2(b) (FIG. 2(a) is a sectional view, and FIG. 2(b) is a top view with line AA' indicating the location where the sectional view is taken), photoresist (not shown) may be formed on the dielectric layer 1501 shown in FIG. 1 and then patterned into a desired shape (a substantially circular shape in this example) by photolithography (exposing and developing), and the dielectric layer 1501, the second source/drain layer 1005, the channel layer 1003 and the first source/drain layer 1031 may be selectively etched by, for example, Reactive Ion Etching (RIE), in sequence with the patterned photoresist as a mask. The etching goes into the first source/drain layer 1031, but stops before reaching a bottom surface of the first source/drain layer 1031 for convenience of subsequent manufacturing of contacts. Then, the second source/drain layer 1005, the channel layer 1003 and an upper portion of the first source/drain layer 1031 are in a pillar shape (a cylindrical shape in this case) after being etched. The RIE may be performed in, for example, a direction substantially perpendicular to a surface of the substrate, and thus the pillar shape extends in the direction substantially perpendicular to the substrate surface. After that, the photoresist may be removed.

In this example, the active regions for the p-type device and the n-type device are patterned respectively in the p-type device region and the n-type device region. Here, for convenience of description, the first source/drain layer, the channel layer and the second source/drain layer for the p-type device are denoted as 1031p, 1003p and 1005p respectively, and the first source/drain layer, the channel layer and the second source/drain layer for the n-type device are denoted as 1031n, 1003n and 1005n respectively. In this stage, the first source/drain layer 1031 is continuous between the p-type device region and the n-type device region, and FIGS. 2(a) and 2(b) schematically shows a boundary between the p-type device region and the n-type device region by a dashed line.

In the following description, when the p-type device region and the n-type device region are described collectively, reference numerals such as 1031, 1003, and 1005 are used; alternatively, when the p-type device region and the n-type device region need to be described separately, reference numerals such as 1031p, 1003p and 1005p, and 1031n, 1003n and 1005n are used, respectively.

In this example (a stack of SiGe-Si-SiGe), Si is strained after the RIE, because SiGe has a greater lattice constant than Si if without being strained. The strain will cause the mobility of holes in Si become greater than that if without the strain, or cause the effective mass of light holes in Si become smaller than that if without the strain, or cause the concentration of light holes in Si become greater than that if without the strain, so that the p-type device will have an increased ON current and thus has its performances improved.

Alternatively, in a case of a stack of Si:C-Si-Si:C, Si is strained after the RIE, because Si:C has a smaller lattice constant than Si, if without being strained. The strain will cause the mobility of electrons in Si become greater than that if without the strain, or cause the effective mass of electrons in Si become smaller than that if without the strain, so that the n-type device will have an increased ON current and thus has its performances improved.

Further, if SiGe is used as the material for the channel layer and Si is used as the material for the source/drain layers, this option will result in not only an increased ON current and but also a reduced OFF current for the p-type device, so that the p-type device's performances are improved. This is because Si has a forbidden band gap greater than that of SiGe, and the mobility of holes in SiGe is higher than that in Si.

Figure 3:
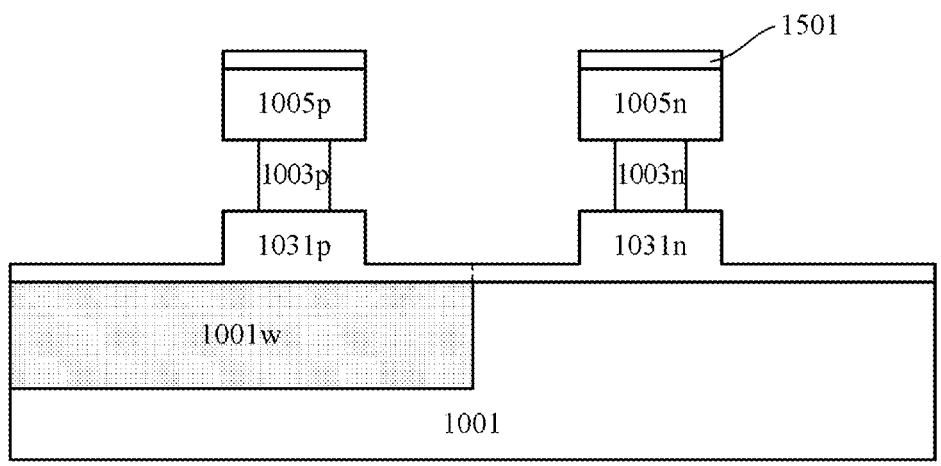

Then, as shown in FIG. 3, a periphery of the channel layer 1003 may be recessed (in this example, in a lateral direction substantially parallel to the substrate surface) with respect to peripheries of the first source/drain layer 1031 and the second source/drain layer 1005. Upper and lower sidewalls of the recess are defined by interfaces between the channel layer 1003 and the second source/drain layer 1005 and between the channel layer 1003 and the first source/drain layer 1031, respectively. For example, this can be done by selectively etching (for example, isotropic etching, such as wet etching using TMAH solution) the channel layer 1003 further with respect to the first source/drain layer 1031 and the second source/drain layer 1005. For example, the selective etching may comprise Atomic Layer Etching (ALE) or digital etching. For example, surfaces of the first source/drain layer 1031, the channel layer 1003 and the second source/drain layer 1005 are oxidized by thermal treatment and respective surface oxide layers thereof are then removed. In a case that the channel layer 1003 comprises SiGe and the first source/drain layer 1031 and the second source/drain layer 1005 comprise Si, oxidation of SiGe is faster than that of Si, and the oxide on SiGe is easier to be removed. Those steps of oxidation and oxide removing can be repeated to achieve the desired recess. In this way, it is possible to well control the recess as compared to the conventional selective etching.

Thus, the active region is defined (i.e., the first source/drain layer 1031, the channel layer 1003 and the second source/drain layer 1005, after being etched). In this example, the active region is substantially in a pillar shape. In the active region, the upper portion of the first source/drain layer may have its periphery substantially aligned with that of the second source/drain layer 1005, while the periphery of the channel layer 1003 is relatively recessed. The upper and lower sidewalls of the recess are defined by the interfaces between the channel layer 1003 and the second source/drain layer 1005 and between the channel layer 1003 and the first source/drain layer 1031, respectively.

Certainly, the active region is not limited to the specific shape illustrated, but can be formed in different shapes according to design layout. For example, the active region may be in an ellipse, a square, a rectangle, or the like in the top view.

Figure 4:
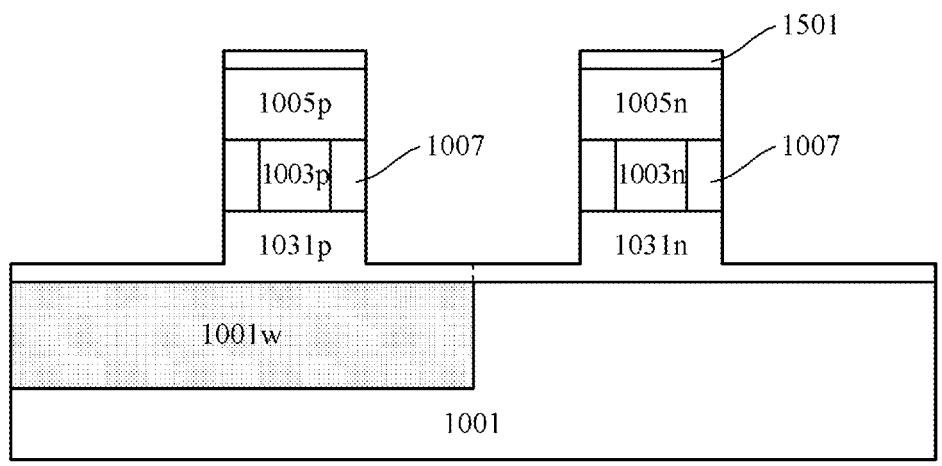

In the recess which is formed by the channel layer 1003 with respect to the peripheries of the upper portion of the first source/drain layer 1031 and the second source/drain layer 1005, a gate stack will be formed later. To prevent the following processes from impacting the channel layer 1003 or leaving some unwanted material(s) in this recess which will impede the formation of the gate stack, a material layer may be filled in the recess to occupy the space for the gate stack (and thus, this material layer may be referred to as a "sacrificial gate"). For example, this can be done by depositing nitride on the structure shown in FIG. 3 and then etching the deposited nitride back by, for example, RIE. The RIE may be performed in a direction substantially perpendicular to the substrate surface, so that the nitride can be left only within the recess, resulting in the sacrificial gate 1007, as shown in FIG. 4. In this case, the sacrificial gate 1007 may substantially fill the recess up.

Figure 5:
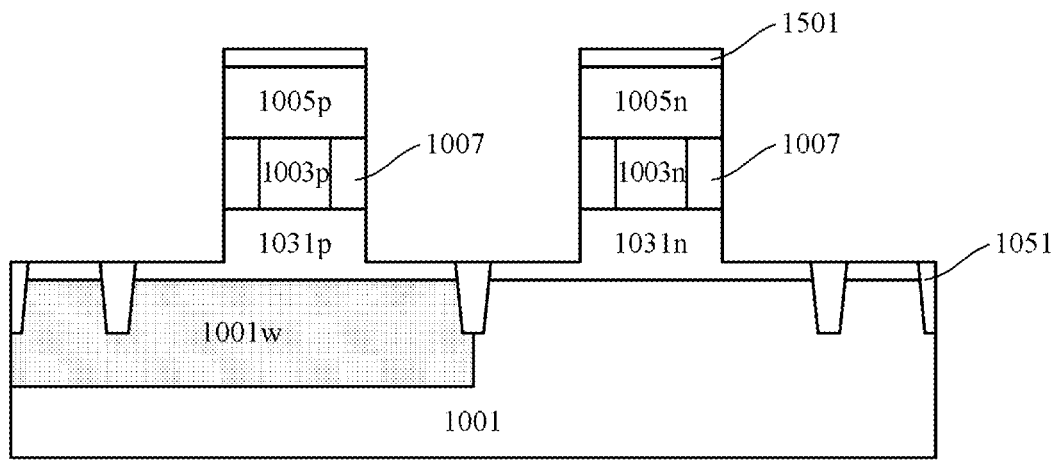

In addition, Shallow Trench Isolation (STI) may be made. For example, STI 1051 may be formed by etching a trench where isolation is required and then filling the trench with oxide, as shown in FIG. 5. Those skilled in the art will recognize a variety of STI processes, which will not be described in detail here. The STI 1051 may be disposed around the active region of the p-type device and the active region of the n-type device, respectively.

Next, source/drain regions may be formed in the first source/drain layer 1031 and the second source/drain layer 1005. The source/drain regions may be formed by doping the first source/drain layer 1031 and the second source/drain layer 1005. For example, this may be done as follows.

Figure 6:
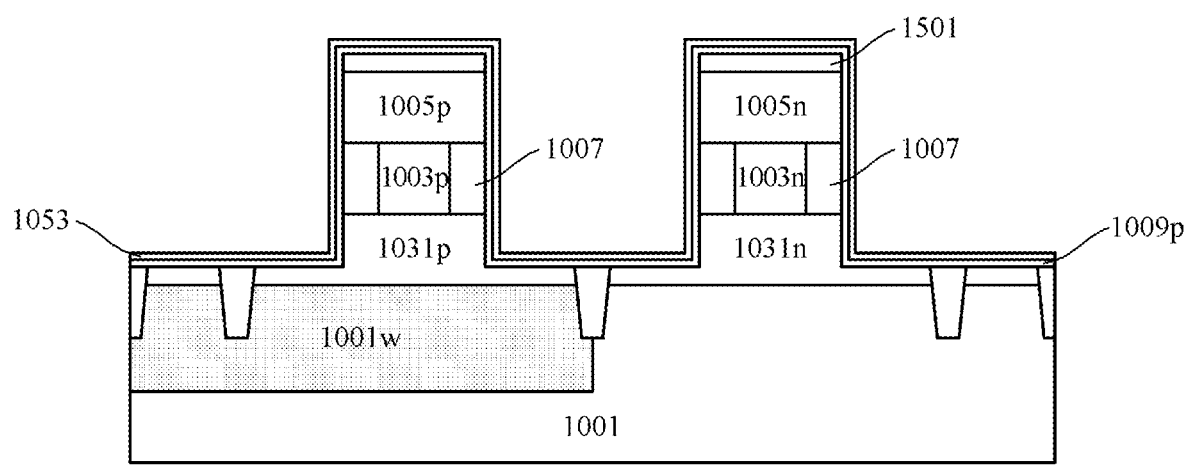

Specifically, as shown in FIG. 6, a p-type dopant source layer 1009p may be formed on the structure shown in FIG. 5. For example, the p-type dopant source layer 1009p may comprise oxide such as silicon oxide, containing p-type dopants such as B therein. Here, the dopant source layer 1009p may be a thin film, with a thickness of about 2-10 nm, and can be deposited in a substantially conformal manner on a surface of the structure shown in FIG. 5 by, for example, Chemical Vapor Deposition (CVD) or Atom Layer Deposition (ALD) etc.

In addition, in order to avoid cross-contamination with an n-type dopant source layer which is to be formed, a diffusion barrier layer 1053 may be formed on the p-type dopant source layer 1009p. For example, the diffusion barrier layer 1053 may include nitride, oxynitride, oxide, or the like, with a thickness of about 0.5-5 nm.

Figure 7:
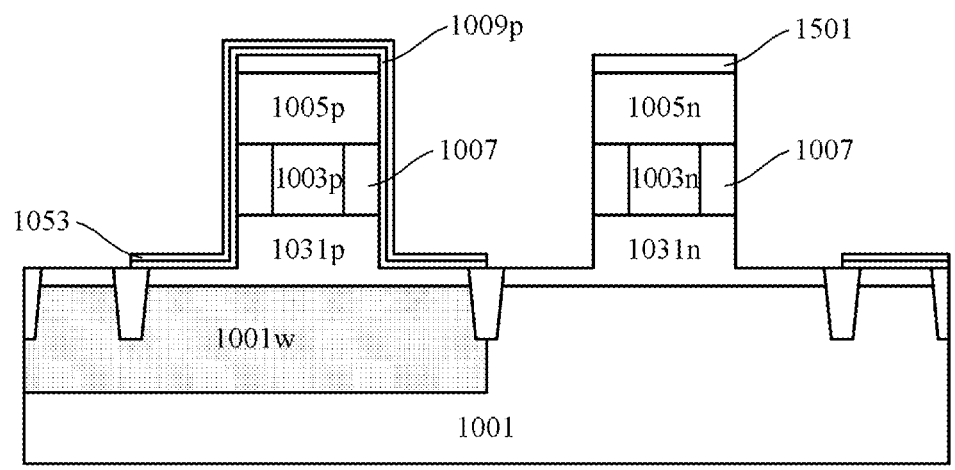

Then, the p-type dopant source layer 1009p (and the diffusion barrier layer 1053) may be patterned (by, for example, photolithography) as shown in FIG. 7, to be left in regions where p-type doping is required. In this example, the p-type dopant source layer 1009p may remain in the p-type device region (because the source/drain layers therein require p-type doping) and a region in the n-type device region where body contact is to be formed (if any, because a p-type body contact region may be formed for the n-type device).

Figure 8:
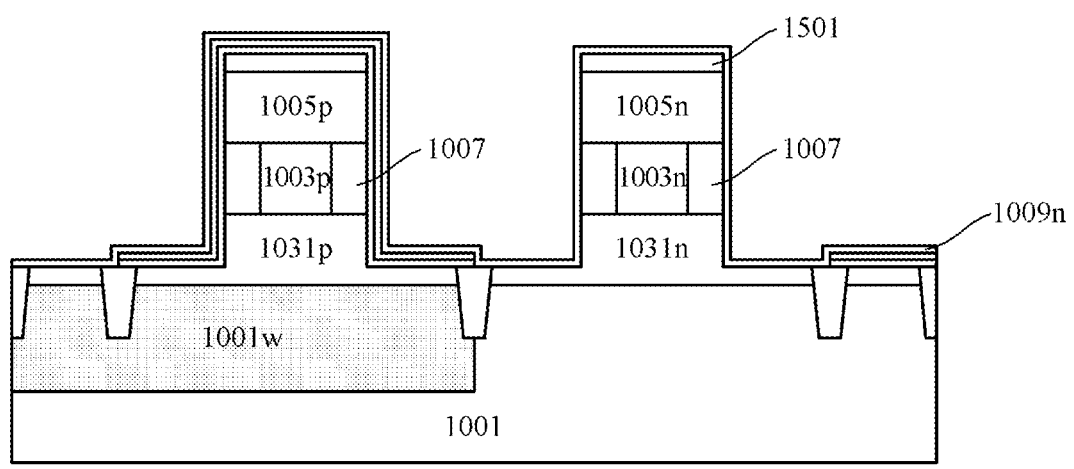

Next, as shown in FIG. 8, the n-type dopant source layer 1009n may be formed on the structure shown in FIG. 7. For example, the n-type dopant source layer 1009n may include oxide containing n-type dopants such as As or P, with a thickness of about 2-10 nm. The n-type dopant source layer 1009n may be formed in the same manner as the p-type dopant source layer 1009p. The n-type dopant source layer 1009n may cover regions where n-type doping is required, such as the n-type device region in the p-type device region (because the source/drain layers therein require n-type doping) and a region where body contact is to be formed (if any, because an n-type body contact region may be formed for the p-type device).

Optionally, another diffusion barrier layer may be formed on the n-type dopant source layer 1009n to suppress outward diffusion or cross-contamination.

Figure 9:
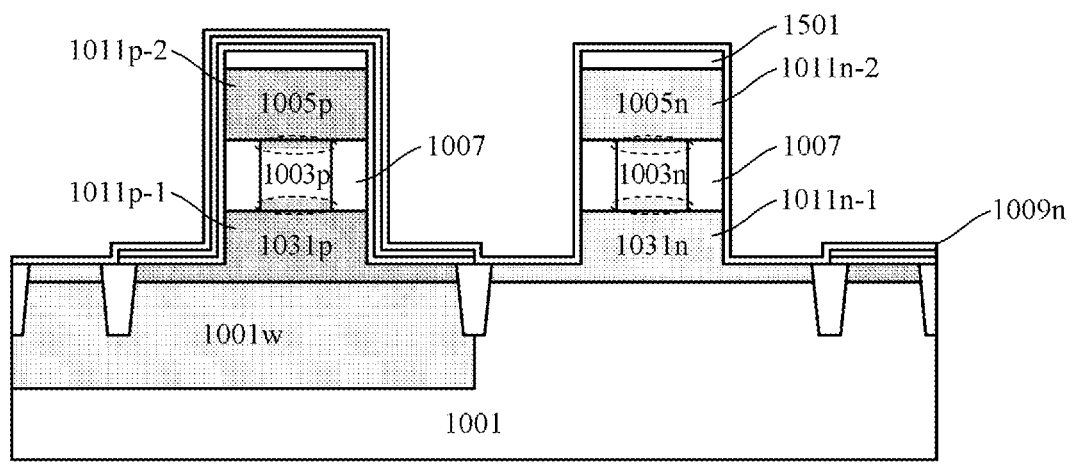

Next, as shown in FIG. 9, dopants included in the dopant source layers 1009p and 1009n may be driven into the active regions by, for example, annealing at about 800-1100° C., so that doped regions are formed therein, as indicated by shadowed regions in the figure. More specifically, in the p-type device region, the p-type device may have one of its source/drain regions 1011p-1 formed in the first source/drain layer 1031p and the other of its source/drain regions 1011p-2 formed in the second source/drain layer 1005p. Similarly, in the n-type device region, the n-type device may have one of its source/drain regions 1011n-1 formed in the first source/drain layer 1031n and the other of its source/drain regions 1011n-2 formed in the second source/drain layer 1005n. After that, the dopant source layers 1009p and 1009n and the diffusion barrier layer 1053 may be removed.

Further, in spite of the sacrificial gate 1007, the dopants may also go into the channel layer 1003 via the first source/drain layer 1031 and the second source/drain layer 1005, so that the channel layer 1003 may have its top and bottom ends with some doping distribution (from which, an extension region is formed, for example), as indicated by dashed ellipses in the figure. Such doping distribution helps to reduce the resistance between the source/drain regions when the device is ON, resulting in improved device performances.

In the above example, the source/drain regions are formed by driving the dopants from the dopant source layer to the active region. However, the present disclosure is not limited thereto. For example, the source/drain regions may be formed by ion implantation, plasma doping (for example, conformal doping along a surface of the structure in FIG. 5), or the like. Certainly, this can be done separately for the region where p-type doping is required and the region where n-type doping is required. When one of the regions is being processed, the other region may be masked with, for example, photoresist. Such localized processing is common in CMOS processes. In addition, if devices of the same conductivity type are to be formed, the source/drain layers may be doped in site while being grown.

In the above example, the p-type dopant source layer 1009p is formed before the n-type dopant source layer 1009n. However, the present disclosure is not limited thereto and their orders may be interchanged.

Figure 34:
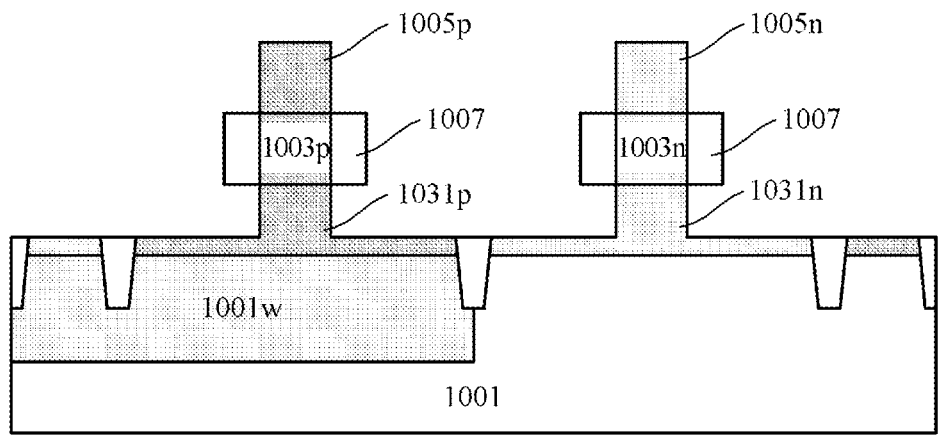
FIGS. 34 and 35 show a process of thinning a source/drain layer according to an embodiment of the present disclosure.
Figure 35:
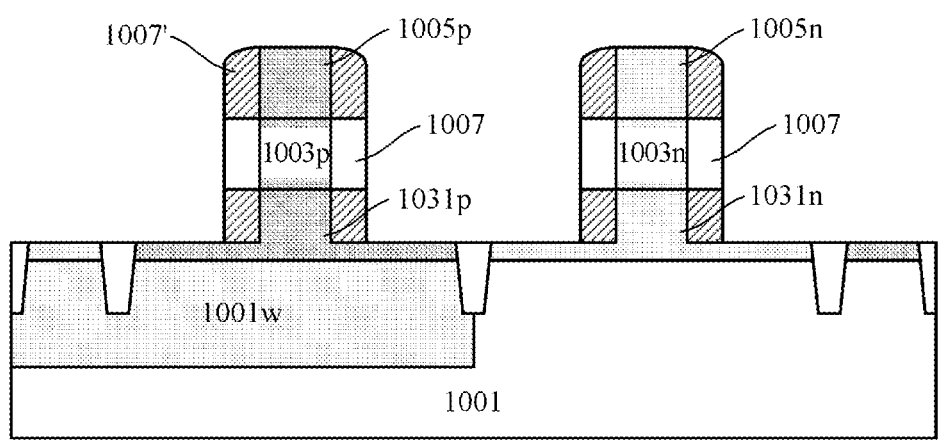

In addition, in order to reduce capacitance between the source/drain and the gate, the source/drain layers may be further thinned and partially replaced with low-k dielectric. For example, as shown in FIG. 34, the source/drain layers in the structure shown in FIG. 9 (with the dopant source layers and the diffusion barrier layer removed) may be selectively etched to become thinner (perhaps even thinner than the channel layer). After that, as shown in FIG. 35, a low-k dielectric spacer 1007' may be formed with low-k dielectric by a spacer formation process.

In addition, in order to reduce the contact resistance, a silicidation process may be performed on the source/drain layers. For example, a layer of NiPt (for example, with a Pt content of about 2-10%, a thickness of about 2-10 nm) may be deposited on the structure shown in FIG. 9 (with the dopant source layers and the diffusion barrier layer removed, or after the source/drain layers are thinned and before the low-k dielectric spacer 1007' is formed as described above), and annealing may be performed at a temperature of about 200-400° C., so that NiPt reacts with Si to produce SiNiPt. After that, residual NiPt which is unreacted may be removed.

Figure 10:
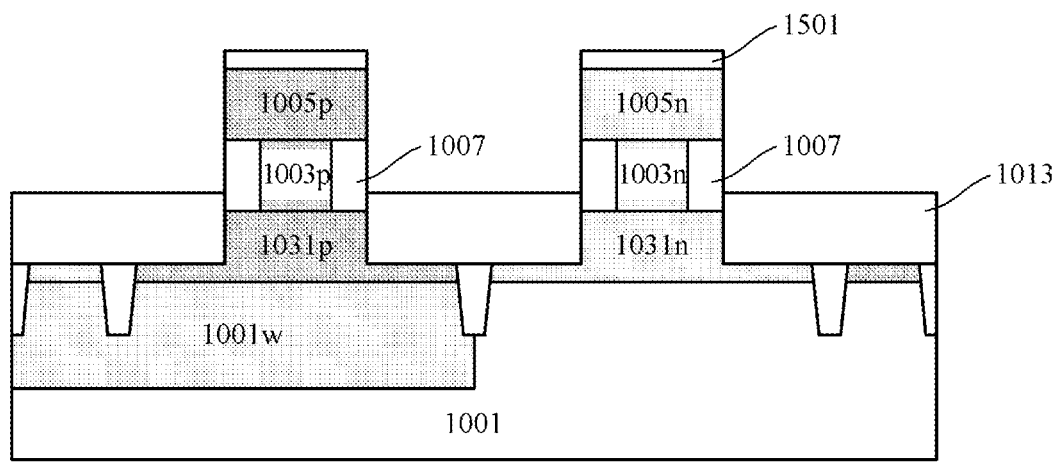

Next, a gate stack may be formed. In order to reduce the overlap between the gate stack and the source/drain layers, a dielectric layer may be formed around the active region to shield the underlying source/drain layer 1031. For example, as shown in FIG. 10, oxide may be deposited on the structure shown in FIG. 9 (or on the structure shown in FIG. 35 in a case that the source/drain layers are thinned), and then etched back to form a dielectric layer 1013. Before the back etching, the deposited oxide may be planarized by, for example, Chemical Mechanical Polishing (CMP) or sputtering. Here, a top surface of the dielectric layer 1013 may be located at a level between top and bottom surfaces of the channel layer 1003, which facilitates the formation of a self-aligned gate stack, which will be described in further detail below.

When the dielectric layer is being formed, the sacrificial gate 1007 may remain to prevent the material of the dielectric layer from going to the recess in which the gate stack is to be accommodated. After that, the sacrificial gate 1007 may be removed to release the space in the recess. For example, the sacrificial gate 1007 (nitride) may be selectively etched with respect to the dielectric layer 1013 (oxide), the second source/drain layer 1005 (SiGe) and the channel layer 1003 (Si). The dielectric layer 1501 of, also nitride in this example, may be removed together with the removal of the sacrificial gate 1007.

Figure 11:
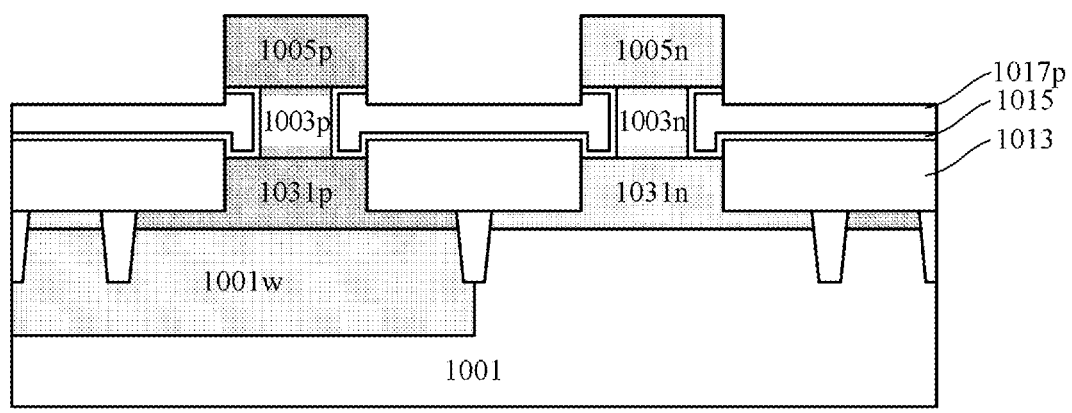

Then, as shown in FIG. 11, the gate stack may be formed in the recess. Here, different gate stacks may be formed for the p-type device and the n-type device, respectively. In the following description, a scenario where the gate stack for the p-type device is firstly formed is described by way of example. However, the present disclosure is not limited thereto, and for example, the gate stack for the n-type device may be formed firstly.

Specifically, a gate dielectric layer 1015 and a gate conductor layer 1017*p* for the p-type device may be deposited in sequence on the structure shown in FIG. 10 (with the sacrifice gate 1007 removed), and the deposited gate conductor layer 1017*p* (and optionally the gate dielectric layer 1015) may be etched back so that a portion thereof outside the recess has its top surface at a level not higher than and preferably lower than the top surface of the channel layer 1003. For example, the gate dielectric layer 1015 may include high K gate dielectric such as HfO$_2$, and the gate conductor layer 1017*p* may include a metal gate conductor. Further, a work function adjustment layer may be formed between the gate dielectric layer 1015 and the gate conductor layer 1017*p*. An interfacial layer of, for example, oxide, may be formed before the formation of the gate dielectric layer 1015.

Due to the arrangement of the top surface of the dielectric layer 1013, the gate stack overlaps with only a side surface of the channel layer 1003 extending in the vertical direction, and does not overlap with respective side surfaces of the first source/drain layer and the second source/drain layer extending in the vertical direction. That is, the gate stack is self-aligned to the channel layer 1003. In this way, the gate stack may be embedded into the recess, and thus overlap with an entire height of the channel layer 1003.

Figure 12:
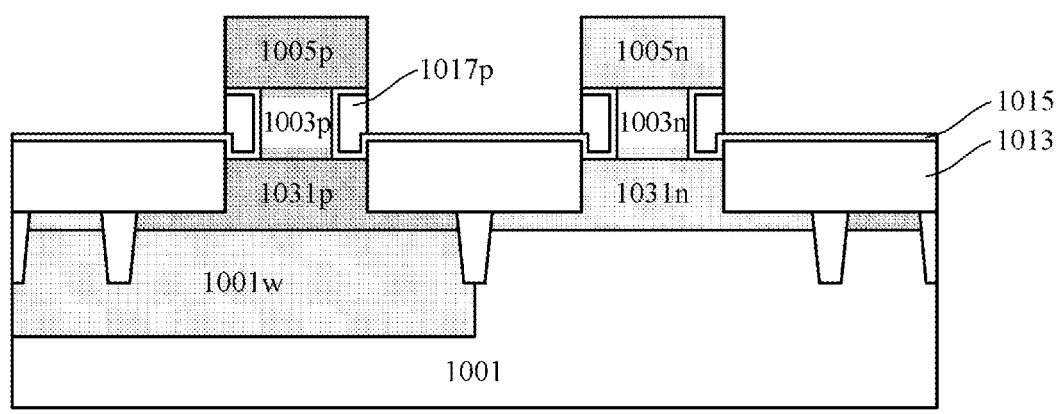
Figure 13:
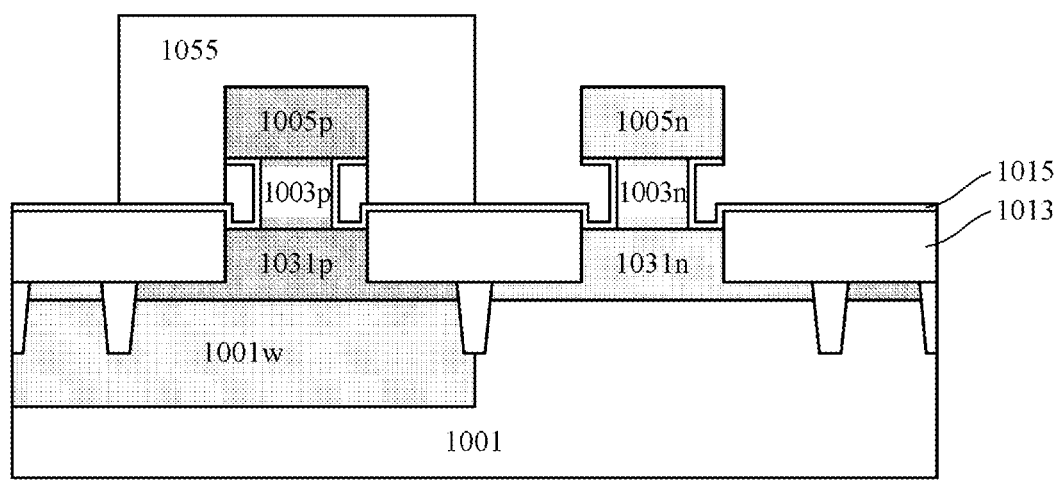

Then, as shown in FIG. 12, the gate conductor layer 1017*p* may be selectively etched by, for example, RIE. The etching may be performed with the active region, especially the second source/drain layer at the top thereof, as a mask. For example, RIE may be performed in a direction substantially perpendicular to the substrate surface, so that the gate conductor layer 1017*p* may be left only in the recess. The etching may be stopped at the gate dielectric layer 1015. Then, as shown in FIG. 13, the gate conductor layer 1017*p* (which is currently within the recess) in the p-type device region may be covered with, for example, photoresist 1055, while the gate conductor layer 1017*p* in the n-type device region is exposed. After that, the gate conductor layer 1017*p* in the n-type device region may be removed by selective etching such as wet etching. Thus, a gate stack (1015/1017*p*) for the p-type device is formed, and is embedded in the recess of the channel layer 1003*p* for the p-type device.

Figure 14:
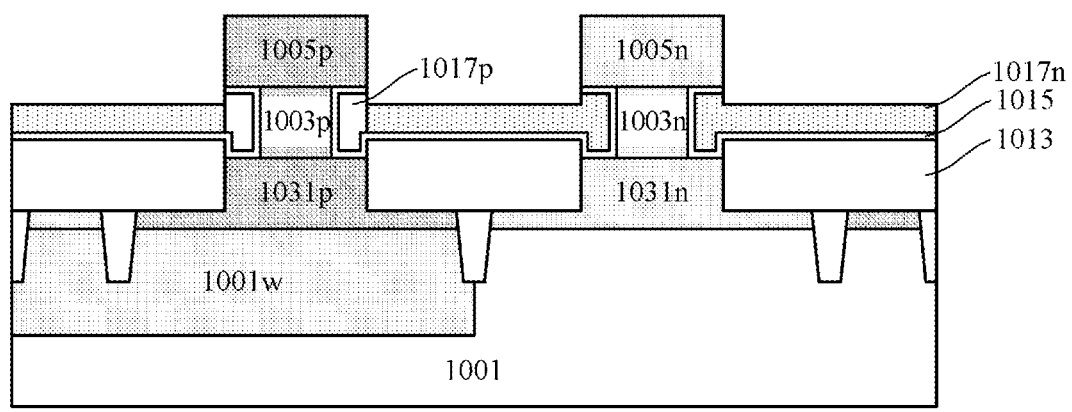

Next, a gate stack for the n-type device may be formed. The gate stack for the n-type device may be similarly formed. For example, as shown in FIG. 14, a gate conductor layer 1017*n* for the n-type device may be formed. For example, the gate conductor layer 1017*n* may be deposited on the structure shown in FIG. 13 (with the photoresist 1055 removed), and the deposited gate conductor layer 1017*n* may be etched back so that a portion thereof outside the recess has its a top surface at a level not higher and preferably lower than the top surface of the channel layer 1003. For example, the gate conductor layer 1017*n* may include a metal gate conductor. In addition, a work function adjustment layer may be formed between the gate dielectric layer 1015 and the gate conductor layer 1017*n*. In this example, the n-type device and the p-type device may share the same gate dielectric layer 1015. Certainly, the present disclosure is not limited thereto. For example, the gate dielectric layer 1015 may be removed, and another gate dielectric layer may be formed for the n-type device. In this example, as both the channel layer 1003*n* for the n-type device and the channel layer 1003*p* for the p-type device are formed by the film growth and selective etching, the channel layer 1003*n* for the n-type device and the channel layer 1003*p* for the p-type device have their respective top surfaces substantially co-planar with each other, and also lower surfaces substantially co-planar with each other.

As can be seen, the gate conductor layer 1017*n* is formed not only in the n-type device region but also in the p-type device region, and is in contact with the gate conductor layer 1017*p*. After that, gate contact pads may be formed using the gate conductor layer 1017*n*, for convenience of making contacts to the gates later.

Certainly, the manner in which the gate stack is formed is not limited thereto. For example, after the formation of the gate stack for the p-type device, the p-type device region may be covered with photoresist and a portion of the gate conductor layer 1017*p* in the n-type device region may be removed by selective etching such as ME. The gate stack for the n-type device may then be formed in the n-type device region (with, for example, the photoresist still remaining to cover the p-type device region).

Figure 15A:
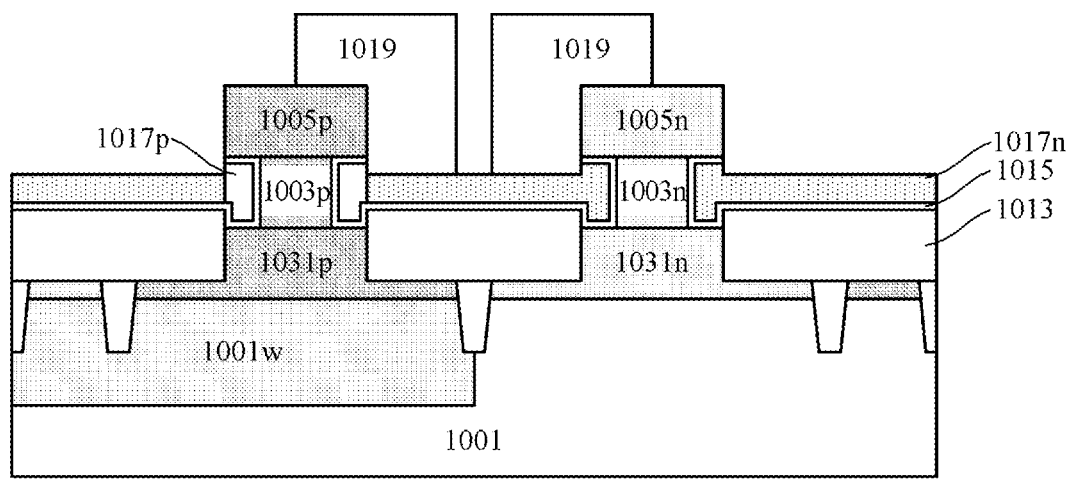
Figure 15B:
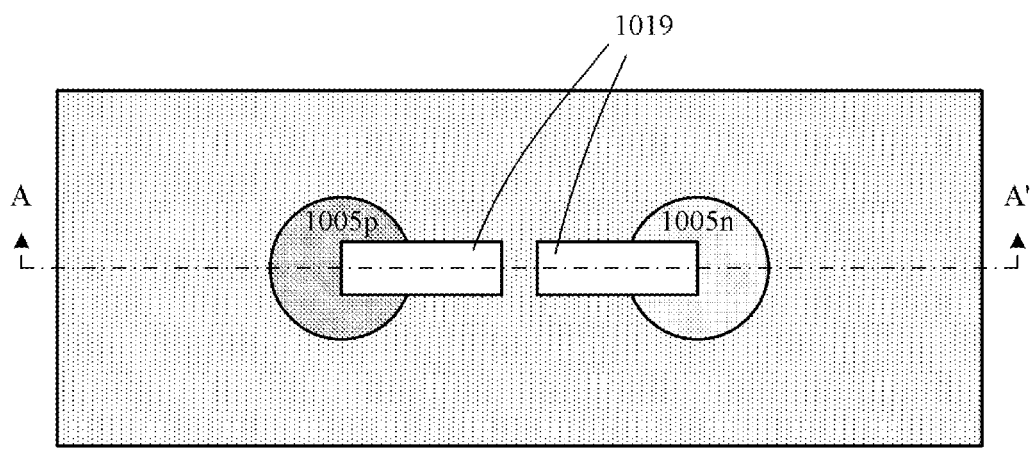

Next, the gate conductor layer 1017*n* may be patterned to form the gate contact pads to facilitate manufacturing of contacts later. For example, as shown in FIGS. 15(*a*) and 15(*b*) (FIG. 15(*a*) is a sectional view, and FIG. 15(*b*) is a top view with line AA' indicating the location where the sectional view is taken), photoresist 1019 may be formed on the structure shown in FIG. 14. The photoresist 1019 is patterned, for example, by photolithography to cover some portions of the gate conductor layer 1017*n* outside the recess while exposing remaining portions of the gate conductor layer 1017*n* outside the recess. In this example, as shown in FIG. 15(*b*), the photoresist 1019 may comprise strips extending outwards in certain directions from peripheries of the respective active regions in the p-type device region and the n-type device region, respectively. For convenience of patterning, the photoresist strips on the p-type device region and the n-type device region are substantially aligned with each other.

Figure 16:
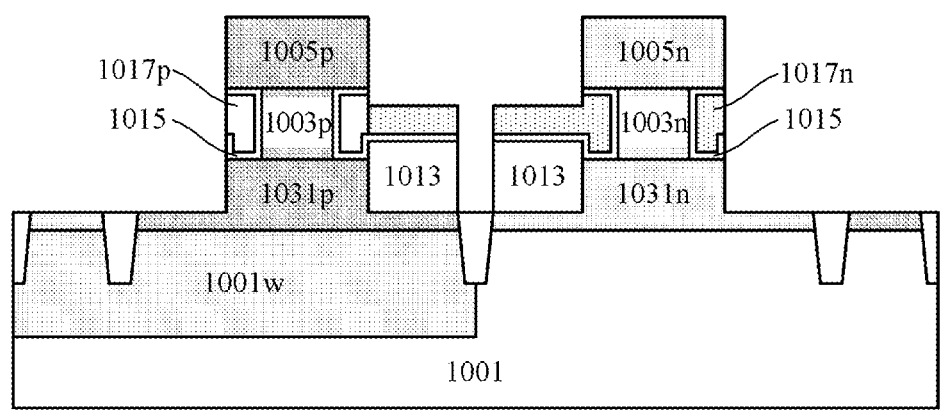

Then, as shown in FIG. 16, the gate conductor layer 1017*n* may be selectively etched by, for example, RIE, with the photoresist 1019 as a mask. In this way, in addition to a portion of the gate conductor layer 1017*n* which remains in the recess, the portions of the gate conductor layer 1017*n* which are covered by the photoresist 1019 are left and serve as the gate contact pads. Later, an electrical connection to the gate stack may be achieved by the gate contact pad.

At this point, the device has been basically completed. As shown in FIG. 16, the semiconductor device according to the present embodiment may include the p-type device and the n-type device each in a form of a vertical device. Each of the p-type device and the n-type device includes the first source/drain layer 1031, the channel layer 1003, and the second source/drain layer 1005 stacked vertically. The source/drain regions are formed in the first source/drain layer 1031 and the second source/drain layer 1005. The channel layer 1003 is laterally recessed, and the gate stack is formed to surround the periphery of the channel layer 1003 and is embedded in the recess. Each of the devices further includes the gate contact pad extending outwards from the gate conductor.

In addition, in the semiconductor device, the strained source/drain technique may be applied. For example, a stressed semiconductor material may be included in the second source/drain layer 1005 which is at an upper end of the semiconductor device.

A liner may be formed on the surfaces of the first source/drain layer 1031 and the second source/drain layer 1005 for the purpose of stress enhancement, protection of the active regions, accurate stop of etching, or the like in subsequent processing.

To do this, further processes may be performed to expose the surfaces of the first source/drain layer 1031 and the second source/drain layer 1005 (actually the surfaces of the second source/drain layer 1005 have already been exposed), in particular upper surfaces thereof on which contacts are to be formed. For example, as shown in FIG. 16, the gate dielectric layer 1015 and the dielectric layer 1013 may be selectively etched, by, for example, RIE. The RIE may be performed in a direction substantially perpendicular to the substrate surface. Thus, the upper surface of the first source/drain layer 1031 except for a portion thereof remaining below the gate stacks and the channel layer is exposed. After that, the photoresist 1019 may be removed.

Figure 17:
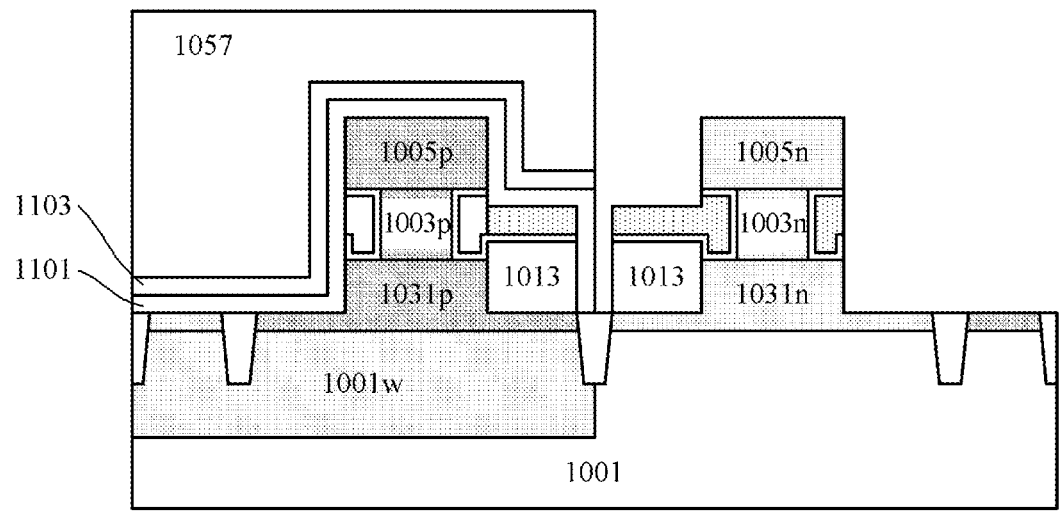

Then, a liner may be formed on the structure shown in FIG. 16. Here, for the purpose of further improving the performances, the liner may be stressed, and different stressed liners may be formed for the p-type device and the n-type device, respectively. For example, as shown in FIG. 17, a (stressed) liner 1101 for the p-type device may be formed on the structure shown in FIG. 16. For example, the liner 1101 may be formed by depositing a nitride layer in a substantially conformal manner. The liner 1101 may have a thickness of about 10-50 nm, and may be tensile stressed to create compressive stress in the channel layer. In addition, an etching stopper layer 1103 of, for example, oxide, may be formed by, for example, deposition, on the liner 1101. Then, photoresist 1057 may be formed to cover the p-type device region, and the etching stopper layer 1103 and the liner 1101 may be selectively etched by, for example, RIE, with the photoresist 1057 as a mask, to be left in the p-type device region. After that, the photoresist 1057 may be removed.

Figure 18:
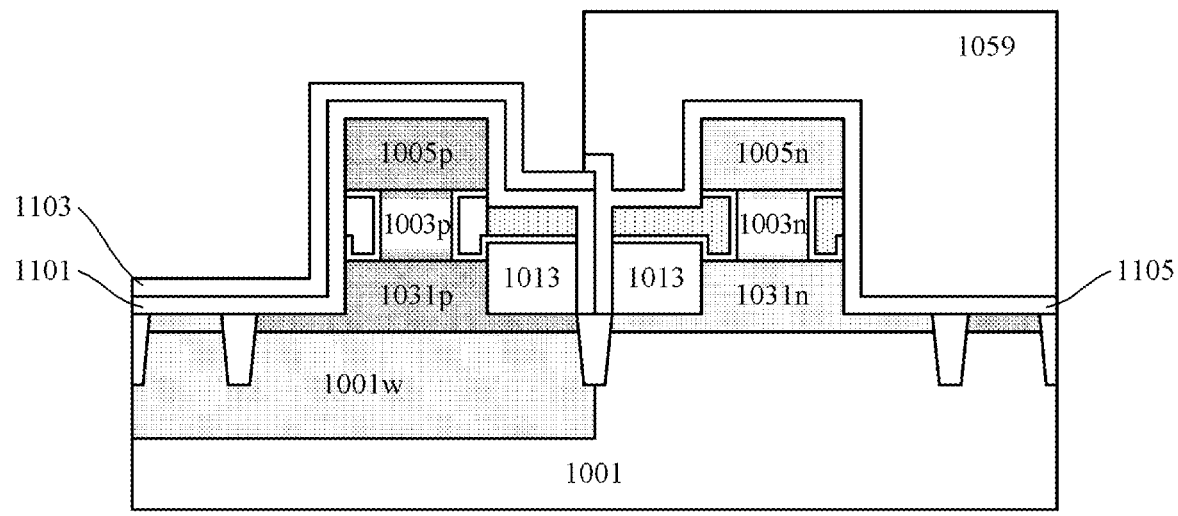

In addition, a liner 1105 may be formed in the n-type device region in a similar manner. For example, as shown in FIG. 18, the (stressed) liner 1105 for the n-type device may be formed on the structure shown in FIG. 17. For example, the liner 1105 may be formed by depositing a nitride layer in a substantially conformal manner. The liner 1105 may have a thickness of about 10-50 nm, and may be compressive stressed to create tensile stress in the channel layer. Then, photoresist 1059 may be formed to cover the n-type device region, and the liner 1105 may be selectively etched by, for example, RIE, with the photoresist 1059 as a mask, to be left in the n-type device region. The ME may be stopped at the etching stopper layer 1103. After that, the photoresist 1059 may be removed.

Thus, the respective (stressed) liners are formed in the p-type device region and the n-type device region, respectively, and the order of making those liners may be interchanged. As shown, the liner may cover the upper surface of the source/drain layer, thus protecting the active region and also acting as an etching stopper layer during etching of contact holes later. Alternatively, a liner may uniformly be formed for the p-type device region and the n-type device region, and the liner may not be stressed, or may be stressed.

As shown, the liners 1101 and 1105 may cover the upper surfaces of the first source/drain layer 1031 and the second source/drain layer 1005, and thus may protect the respective active regions and subsequently act as etching stopper layers.

Figure 19:
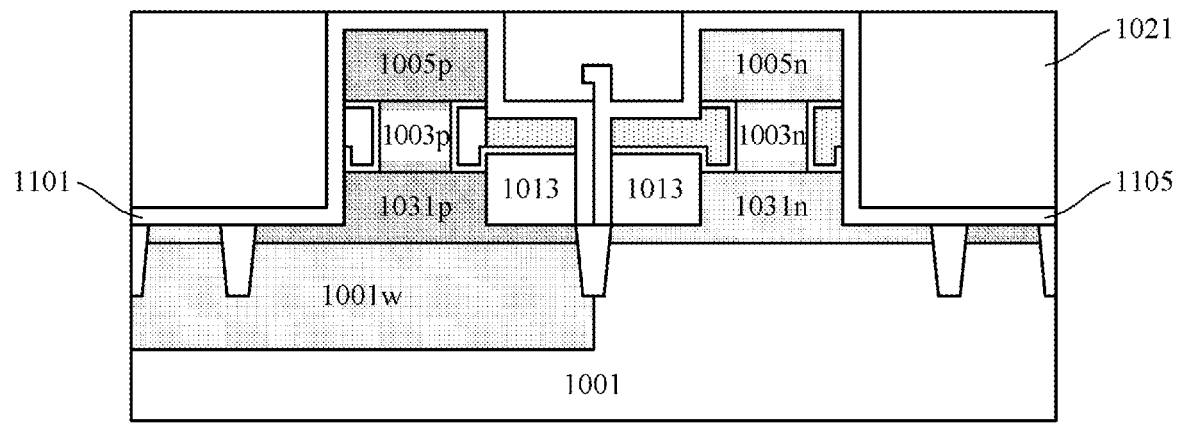

Then, as shown in FIG. 19, an interlayer dielectric layer 1021 may be formed on the structure shown in FIG. 18. For example, the interlayer dielectric layer 1021 may be formed by depositing oxide and then planarizing it by, for example, CMP. The CMP may be stopped at the liner 1101. In FIG. 19, the etching stopper layer 1103 of oxide is shown to be integral with the interlayer dielectric layer 1021.

Next, processes for strained source/drain may be performed. Here, the p-type device and the n-type device may be processed separately for strained source/drain. As would be understood, it is possible to process only one of the devices, or to change an order of the processes.

Figure 20:
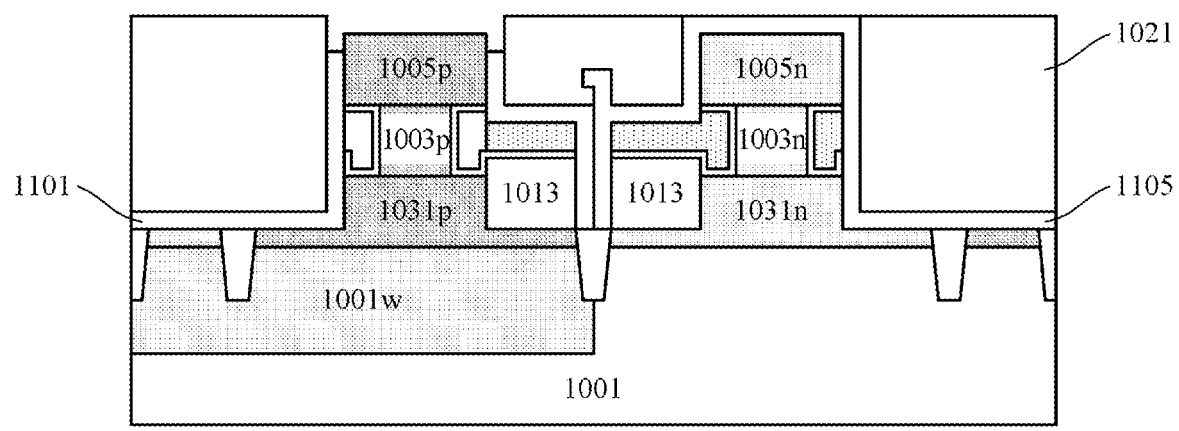

For example, as shown in FIG. 20, the liner 1101 for the p-type device region may be patterned to at least partially expose a top surface of the second source/drain layer 1005*p*. Here, the liner 1101 may be selectively etched by, for example, RIE. The RIE may be performed, for example, in a direction substantially perpendicular to the substrate surface. Thus, a portion of the liner 1101 on the top surface of the second source/drain layer 1005*p* may be removed, and a vertical portion of the liner 1101 may have its top end also partially removed. Thus, there is an opening left in the interlayer dielectric layer 1021 (and the liner 1101), through which the second source/drain layer 1005*p* is exposed.

Figure 21A:
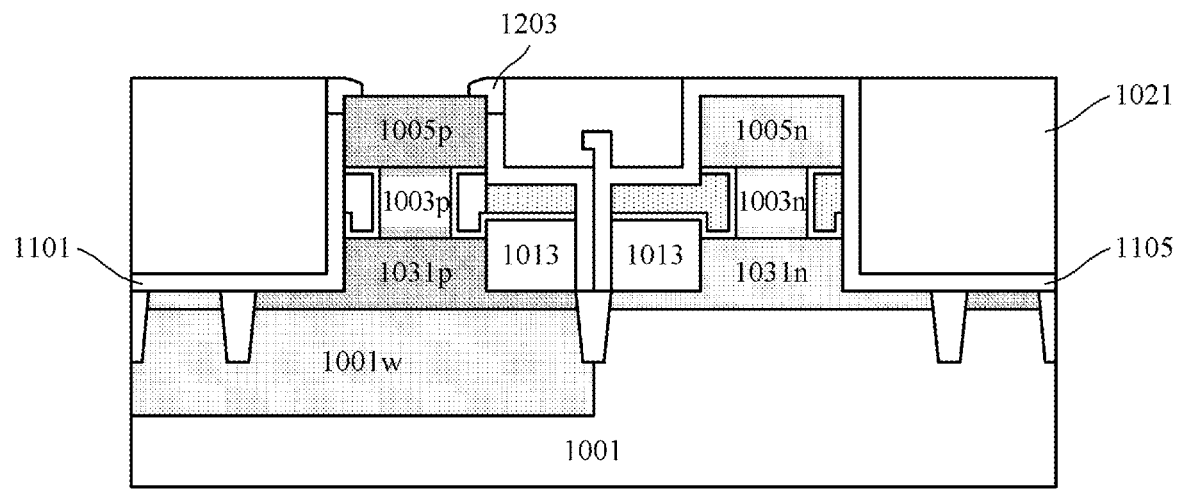

Then, as shown in FIG. 21(*a*), a spacer 1203 may be formed on sidewalls of the opening formed as described above in the interlayer dielectric layer 1021. For example, the spacer 1203 may include nitride, with a width (a dimension in a horizontal direction in the figure) being large enough to cover portions of the semiconductor layer 1005 close to the sidewalls of the semiconductor layer 1005 (but not to cover the entire top surface of the second source/drain layer 1005*p*). Those skilled in the art are aware of a variety of ways to form the spacer. For example, a nitride layer may be deposited on the structure shown in FIG. 20 in a substantially conformal manner, and the deposited nitride layer may be subjected to RIE in a direction substantially perpendicular to the substrate surface to remove horizontally extending portions thereof and leave vertically extending portions thereof (on the sidewalls of the opening) to result in the spacer. The width of the spacer 1203 is substantially determined by a thickness of the deposited nitride.

According to another embodiment, as shown in FIG. 21(*b*), in a case where silicide 1005*s* is formed on the surfaces of the first source/drain layer 1031*p* and the second source/drain layer 1005*p* as described above (only for the sake of convenience, the silicide formed on the surface of the first source/drain layer 1031*p* is not shown), after the opening is formed in the interlayer dielectric layer 1021 (and the liner 1101) as described above, the second source/drain layer 1005*p* may be selectively etched by, for example, RIE, so that the second source/drain layer 1005*p* is recessed to a certain extent. After that, a spacer formation process may be performed as described above. Thus, not only the spacer may be formed on the sidewalls of the opening in the interlayer dielectric layer 1021, but also a spacer 1203' may be formed on sidewalls of the silicide 1005s.

Figure 21B:
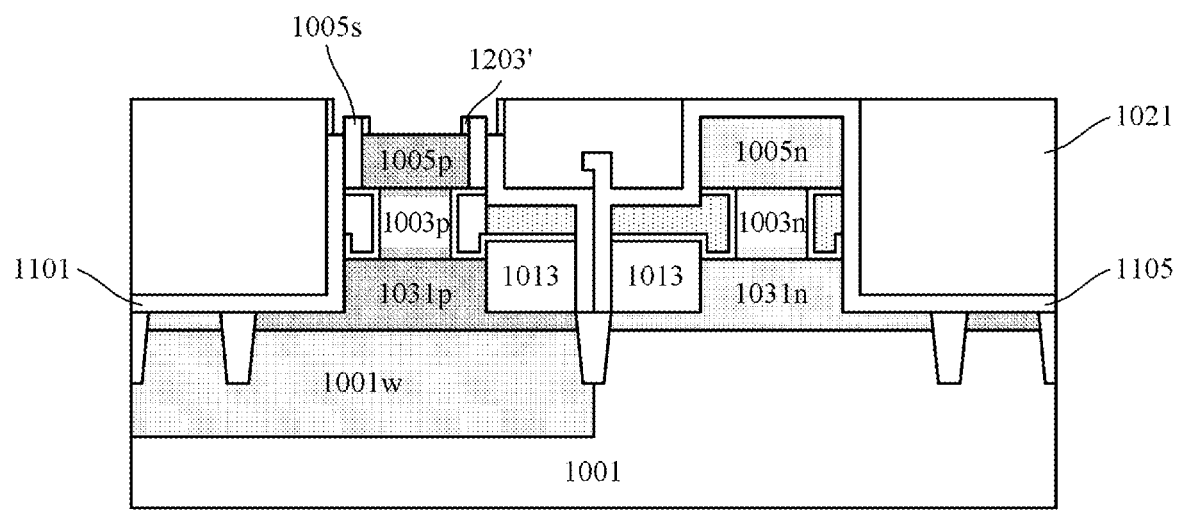

In the following description, the scenario shown in FIG. 21 (a) is described by way of example. However, it should be understood by those skilled in the art that the processes described below are also applicable to the scenario illustrated in FIG. 21(b).

Figure 22:
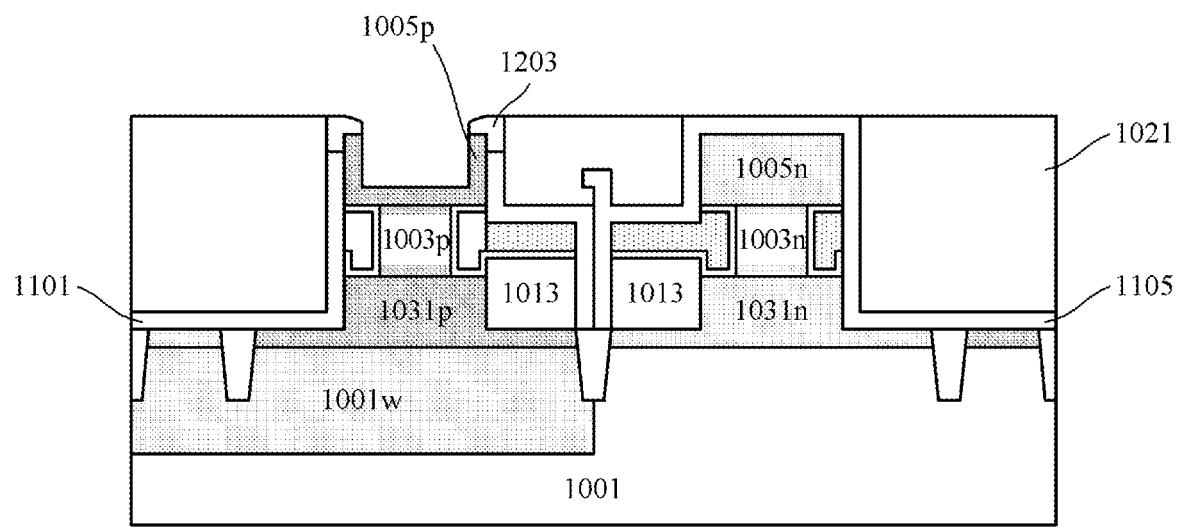

Then, as shown in FIG. 22, the second source/drain layer 1005p may be selectively etched using the formed spacer 1203 as a mask. Here, RIE may be used, or Atomic Layer Etching (ALE) may be used for accurate control of an etching depth and reduction of loading effects. The etching does not proceed to a bottom surface of the second source/drain layer 1005p, and portions of the second source/drain layer 1005p at the bottom thereof remain. The portions of the second source/drain layer 1005p close to its sidewalls also remain due to the presence of the spacer 1203. Thus, the second source/drain layer 1005p is in a "U" shape.

Figure 23:
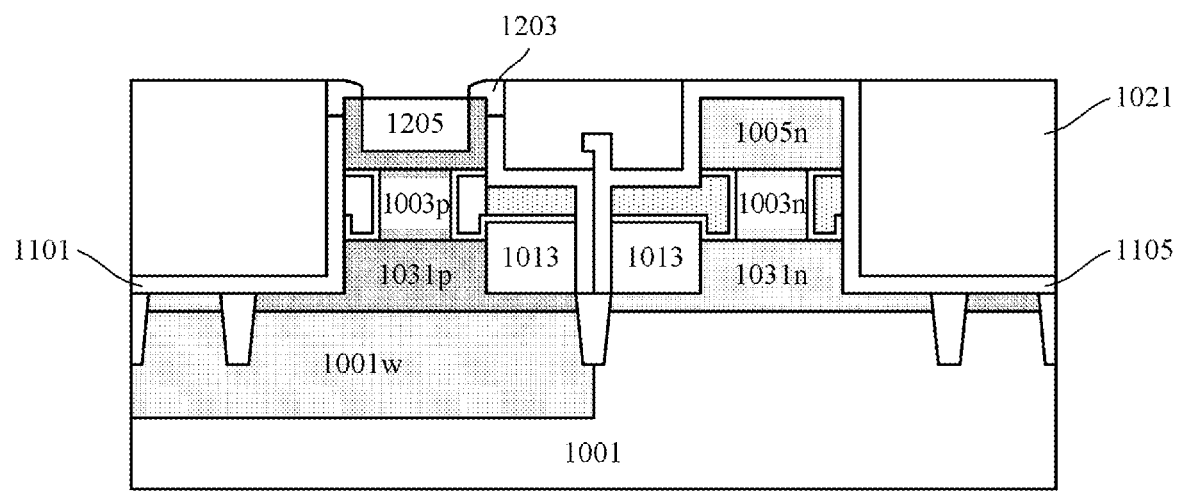

Next, as shown in FIG. 23, the stressed semiconductor material 1205 may be epitaxially grown using remaining portions of the second source/drain layer 1005p as a seed. Since the second source/drain layer 1005p is in a "U" shape, epitaxial growth may proceed from the bottom and sidewall portions of the second source/drain layer 1005p, which facilitates forming an epitaxial layer with high quality. Here, the liner 1101 (in combination with the interlayer dielectric layer 1021) functions as a stress retention or enhancement mechanism, and thus may be referred to as a stress enhancement layer. Upon epitaxial growth of the stressed semiconductor material 1205, the stress enhancement layer limits free movement of the remaining portions of the second source/drain layer 1005p or the seed, thereby increasing the stress applied to the channel. The stress enhancement layer may have stress opposite to that in the grown stressed semiconductor material.

The semiconductor material 1205 may create compressive stress in the channel layer for the p-type device. For example, in this example (in which the source/drain layers include SiGe and the channel layer include Si), for the p-type device, the semiconductor material 1205 may include SiGe (with an atomic percentage of Ge greater than that in the second source/drain layer). Certainly, the semiconductor material 1205 is not limited thereto, and may include other semiconductor materials having a different lattice constant from the second source/drain layer 1005p, for example, GeSn, group III-V compound semiconductor materials, or the like. In addition, the semiconductor material 1205 may be doped in-situ while being grown, for example, p-type doping for the p-type device (with a doping concentration of, for example, about 1E18-2E20 $cm^{-3}$).

Figure 24:
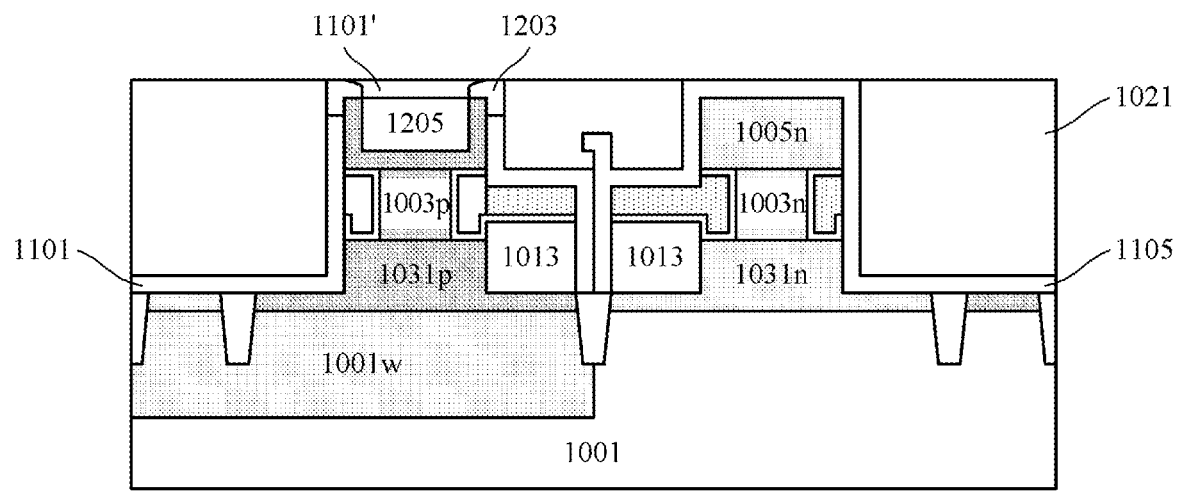

As described above, in order to apply the strained source/drain technique, the opening is formed in the liner 1101. The liner 1101 may be repaired for the purpose of providing protection of the active regions, an etching stopper layer or the like. As shown in FIG. 24, a liner supplement portion 1101' may be formed in the opening. For example, nitride may be deposited on the structure shown in FIG. 23, and may be planarized by, for example, CMP. The CMP may be stopped at the interlayer dielectric layer 1021. Thus, the nitride is filled in the opening to form the liner supplement portion 1101'.

Figure 25:
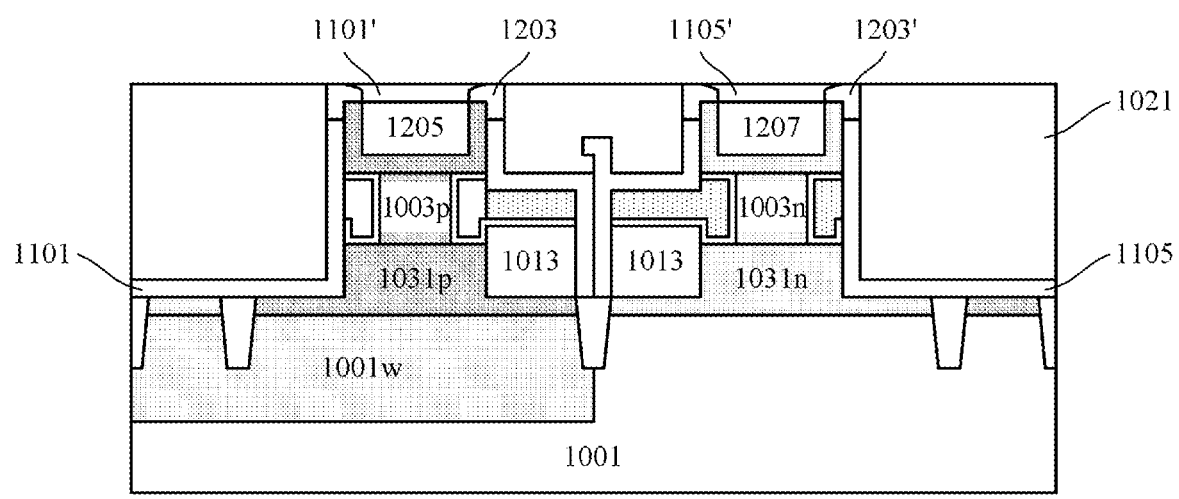

After that, the n-type device may be processed in the same manner. For example, an opening may be formed in the interlayer dielectric layer 1021 and the liner 1105, a spacer 1203' may be formed on sidewalls of the opening, and the second source/drain layer 1005n may be selectively etched through the opening to leave a U-shaped seed layer. A semiconductor material 1207 may be grown on the seed layer, and a liner supplement portion 1105' may be formed to repair the liner 1105. Thus, the structure as shown in FIG. 25 may be obtained.

The semiconductor material 1207 may create tensile stress in the channel layer for the n-type device. For example, in this example (in which the source/drain layers include SiGe and the channel layer include Si), for the n-type device, the semiconductor material 1207 may include SiGe (with an atomic percentage of Ge less than that in the second source/drain layer). Certainly, the semiconductor material 1207 is not limited thereto, and may include other semiconductor materials having a different lattice constant from the second source/drain layer 1005n, for example, Si:C, GeSn or group III-V compound semiconductor materials. In addition, the semiconductor material 1207 may be doped in-situ while being grown, for example, n-type doping for the n-type device (with a doping concentration of, for example, about 1E18-1E21 $cm^{-3}$).

Since stress is created in the channels by the strained source/drain technique, the device performances can be further improved.

In the above embodiments, the spacer 1203 or 1203' is used as a mask in etching the second source/drain layer 1005. Unlike this, in the present embodiment, the spacer 1203 or 1203' may not be formed. For example, after an opening is formed in the interlayer dielectric layer and the liner as described above in connection with FIG. 20, the exposed semiconductor layer 1005 may be selectively etched directly. Likewise, the etching may not proceed to the bottom surface of the semiconductor layer 1005, and portions of the semiconductor layer 1005 at the bottom thereof may remain. Here, since there is no spacer, the remaining portions of the semiconductor layer 1005 may have no vertically extending portions, and thus may be substantially planar.

Certainly, the semiconductor layer 1005 may be completely etched away. For example, the etching of the semiconductor layer 1005 may be stopped at the channel layer 1003. Subsequently, a stressed semiconductor layer may be grown using the channel layer 1003 as a seed layer.

Various contacts may then be formed in the interlayer dielectric layer 1021.

Figure 26:
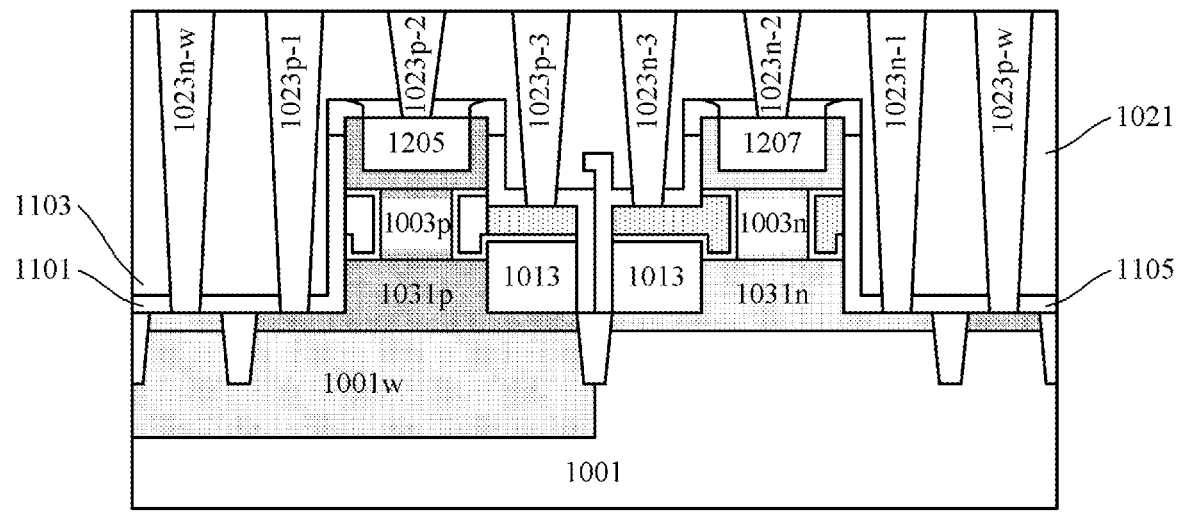

Specifically, as shown in FIG. 26, the interlayer dielectric layer 1021 may be thickened. For example, oxide may be further deposited on the interlayer dielectric layer 1021, and the deposited oxide may be planarized by, for example, CMP, to thicken the interlayer dielectric layer. In the interlayer dielectric layer 1021, for the p-type device region, a contact 1023p-1 to the source/drain region 1011p-1, a contact 1023p-2 to the source/drain region 1011p-2, a contact 1023p-3 to the gate conductor layer 1017, and a contact 1023n-w to the well region 1001w may be formed. Similarly, for the n-type device region, a contact 1023n-1 to the source/drain region 1011n-1, a contact 1023n-2 to the source/drain region 1011n-2, and a contact 1023n-3 to the gate conductor layer 1017 and a contact 1023p-w to the p-type substrate 1001 may be formed. These contacts may be formed by etching holes in the interlayer dielectric layer 1021 and the liners and filling the holes with a conductive material such as metal (for example, tungsten). Before filling the metal, a barrier layer of, for example, TiN, may be formed on inner walls of the contact holes.

In etching the contact holes, the etching of the interlayer dielectric layer 1021 may be stopped at the liners, and then the liners which have substantially uniform thickness may be etched. It is difficult for the contact holes to be etched because the contact to the source/drain region and the contact to the gate conductor layer have different heights. In the present embodiment, however, it is relatively easy to control the stop of the etching of the contact holes due to the presence of the liners.

Due to the presence of the gate contact pad, it is relatively easy to make the contact to the gate. Further, because the doped region in the first source/drain layer extends beyond the active region and has at least a portion thereof not covered by the gate contact pad, it is relatively easy to make the contact thereto.

Figure 27:
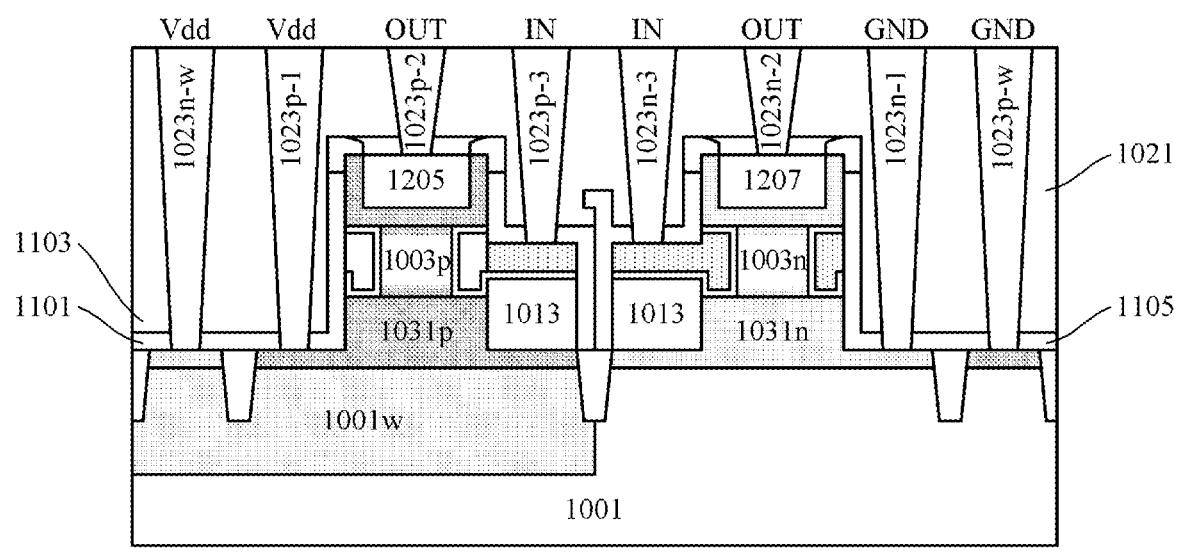
FIGS. 27 and 28 show connections of terminals of a semiconductor device in a CMOS configuration according to an embodiment of the present disclosure, respectively.
Figure 28:
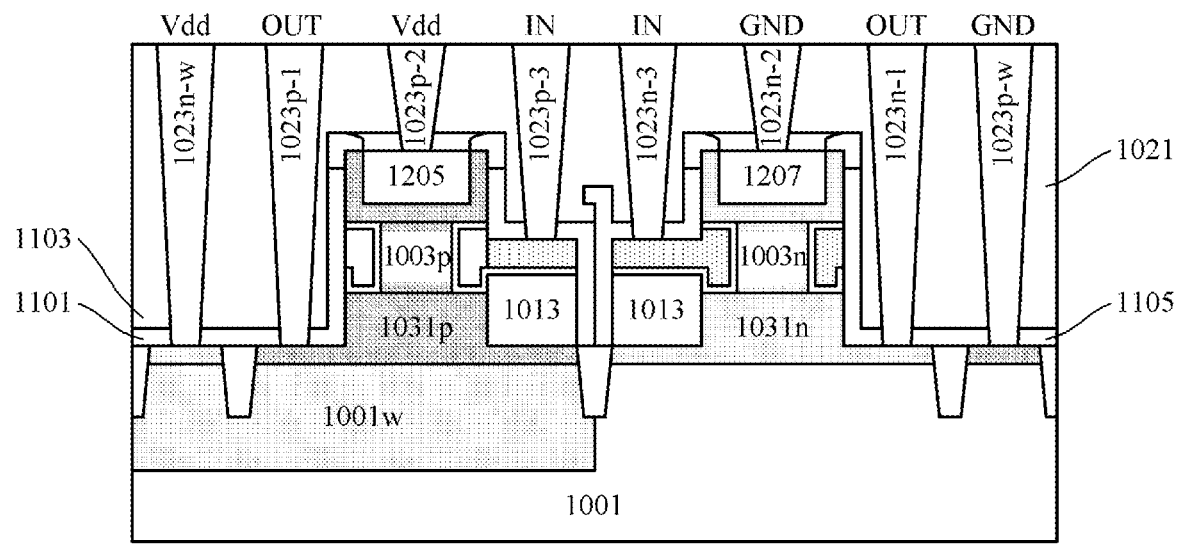

FIGS. 27 and 28 show connections of terminals of a semiconductor device in a CMOS configuration according to the present embodiment, respectively.

As shown in FIG. 27, for the p-type device, the first source/drain layer 1031p and the n-type well may be connected to a power supply voltage Vdd, the gate may be connected to an input signal IN, and an output signal OUT may be outputted from the second source/drain layer 1005p. Similarly, for the n-type device, the first source/drain layer 1031n and the p-type substrate may be connected to a ground voltage GND (here Vdd is assumed to be greater than GND), the gate may be connected to the input signal IN, and the output signal OUT may be outputted from the second source/drain layer 1005n. In this connection, there is no junction leakage between the first source/drain layer and the well region (or the p-type substrate) in the p-type device region and the n device region. However, there may be junction leakage between the wells (between the n-type well region and the p-type substrate).

Alternatively, as shown in FIG. 28, connections of the first source/drain layer and the second source/drain layer shown in FIG. 27 may be interchanged. In this connection, although there may be junction leakage between the first source/drain layer and the well region (or the p-type substrate), area saving may be achieved in some cases because the n-type device and the p-type device can share contacts. This will be further described below.

FIGS. 29 to 32 are schematic views showing some stages in a flow of manufacturing a semiconductor device according to another embodiment of the present disclosure.

Figure 29:
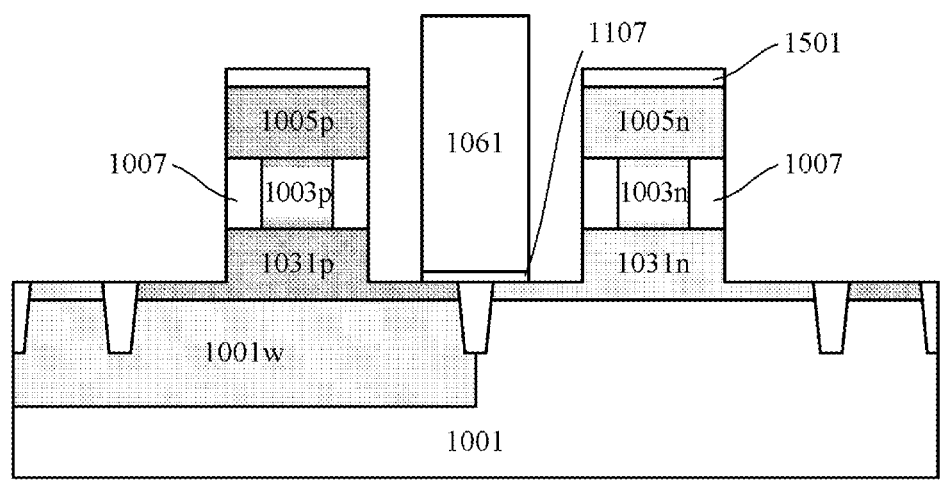
FIGS. 29 to 32 are schematic views showing some stages in a flow of manufacturing a semiconductor device according to another embodiment of the present disclosure.

After the formation of the source/drain regions and the removal of the dopant source layers and the diffusion barrier layer as described above in connection with FIG. 9, a conductive bridge 1107 may be formed between the p-type device region and the n-type device region, as shown in FIG. 29. For example, a conductive material layer of, for example, metal may be deposited on the structure shown in FIG. 9 (with the dopant source layers and the diffusion barrier layer removed). Then, photoresist 1061 may be formed and patterned to cover a portion of the conductive material extending between the p-type device region and the n-type device region. After that, the conductive material may be selectively etched by, for example, RIE, with the photoresist 1061 as a mask, to obtain the conductive bridge 1107. The conductive bridge 1107 spans across the STI to electrically connect the first source/drain layer 1031p of the p-type device and the first source/drain layer 1031n of the n-type device.

Alternatively, a Si layer may be formed in the same manner as the conductive bridge 1107. Then, in a case of performing silicidation, the Si layer may be converted into conductive silicide and constitute the conductive bridge 1107.

Next, the process may be carried out in the same manner as in the above embodiments.

Figure 30A:
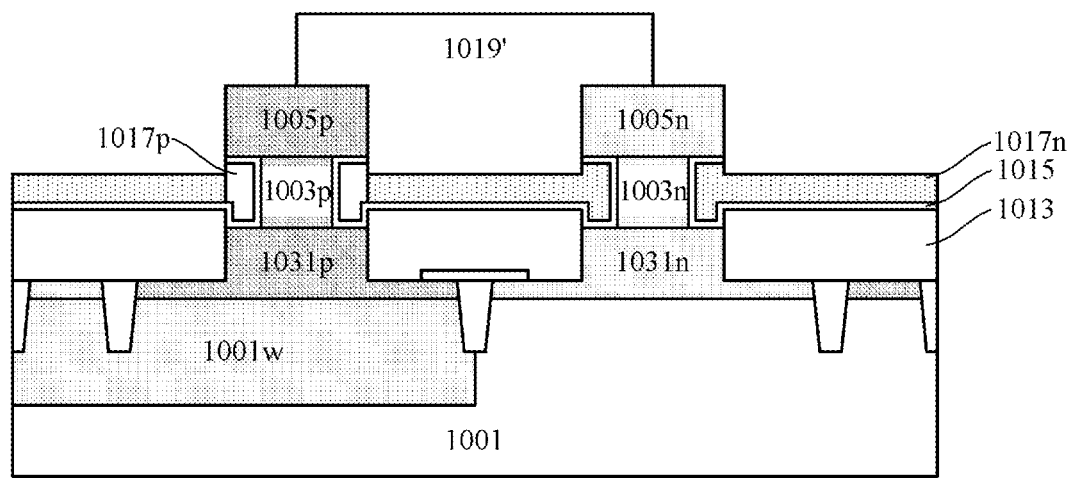
Figure 30B:
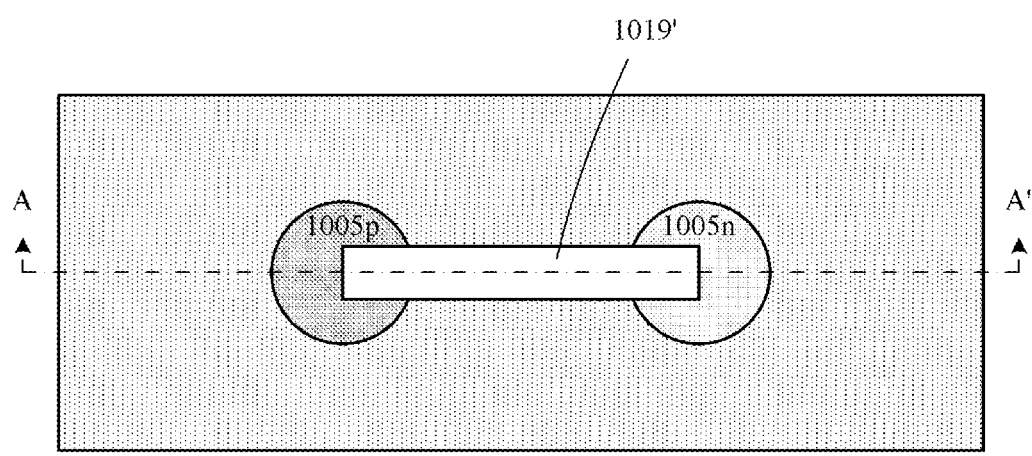
Figure 31A:
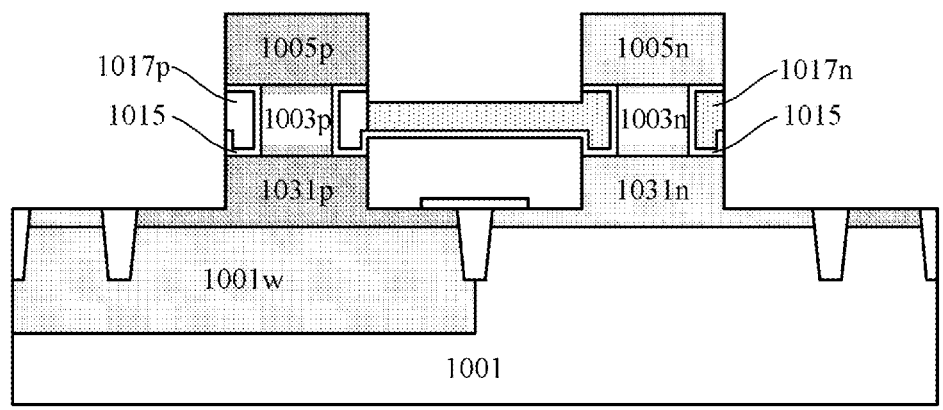
Figure 31B:
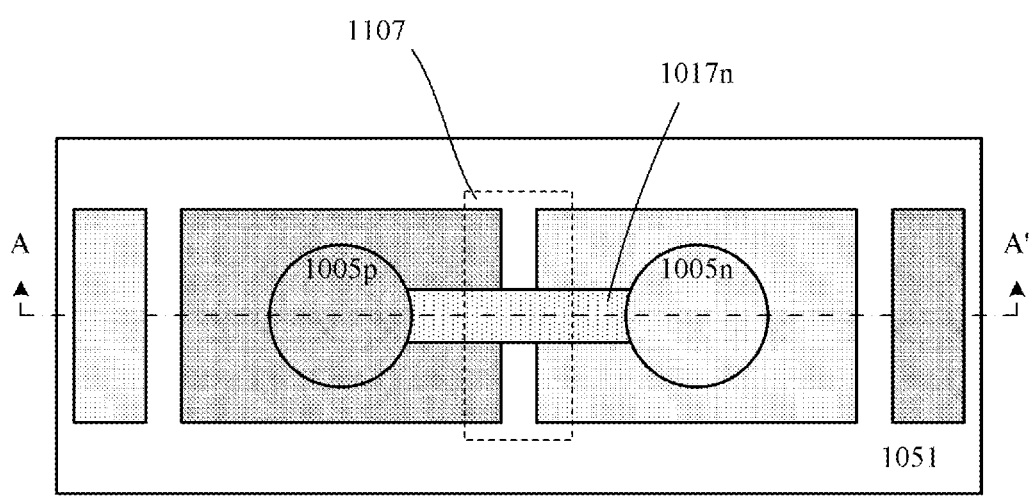

As shown in FIGS. 30(a) and 30(b) (FIG. 30(a) is a sectional view, and FIG. 30(b) is a top view with line AA' indicating the location where the sectional view is taken), the respective gate stacks for the p-type device and the n-type device may be formed, and then photoresist 1019' may be formed to pattern the gate conductor layer into the gate contact pads. Differently from the embodiments described above, in this example, the photoresist 1019' continuously extends between the p-type device region and the n-type device region. Then, as shown in FIGS. 31(a) and 31(b) (FIG. 31(a) is a sectional view, and FIG. 31(b) is a top view with line AA' indicating the location where the sectional view is taken), the gate conductor layer 1017n extends from the n-type device to the p-type device. In addition, in FIG. 31(b), the conductive bridge 1017 is schematically shown by a dashed box.

Figure 32:
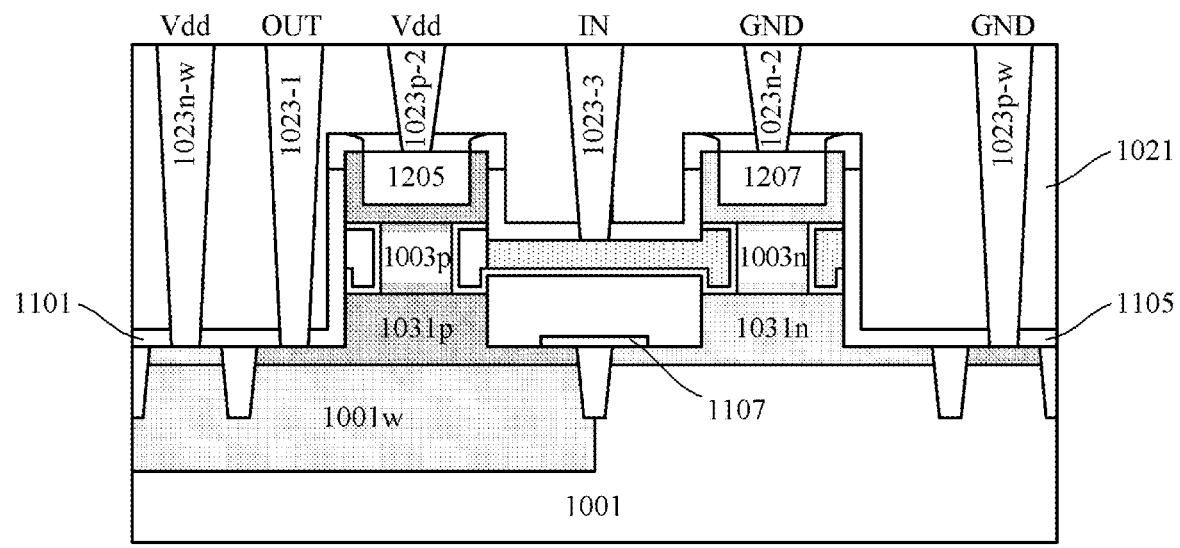

FIG. 32 shows a structure of the device after the formation of the contacts. As shown in FIG. 32, in this example, the p-type device and the n-type device may share the gate contact 1023-3 and the source/drain contact 1023-1. Other connections may be the same as those in the foregoing embodiments. It can be seen that the number of the contacts is reduced from 8 to 6, so that an area for the contacts can be reduced.

Figure 33:
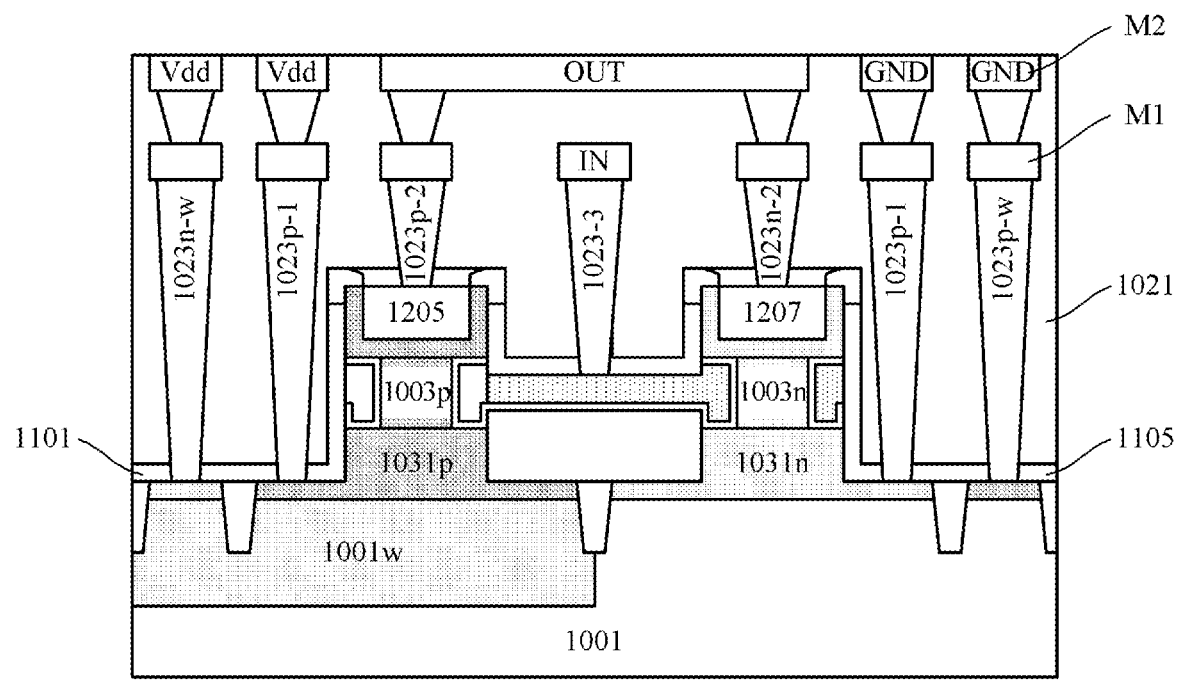
FIG. 33 is a cross-sectional view showing a semiconductor device according to another embodiment of the present disclosure.

FIG. 33 is a cross-sectional view showing a semiconductor device according to another embodiment of the present disclosure.

Several layers in metalization, such as a first metal layer M1 and a second metal layer M2 and vias therebetween, are shown in FIG. 33. The p-type device and the n-type device may share the gate contact 1023-3 and may receive an input signal therefrom. However, in this example, there is no conductive bridge formed. The respective source/drain contacts 1023p-2 and 1023n-2 of the p-type device and the n-type device may be interconnected together in the second metal layer M2 and constitute an output. In the connection shown in FIG. 33, there is no junction leakage between the source/drain layer and the well region as described above, so that the power consumption can be reduced.

According to embodiments of the present disclosure, the channel layer may have different thicknesses in different device regions (thereby providing different gate lengths).

Figure 36:
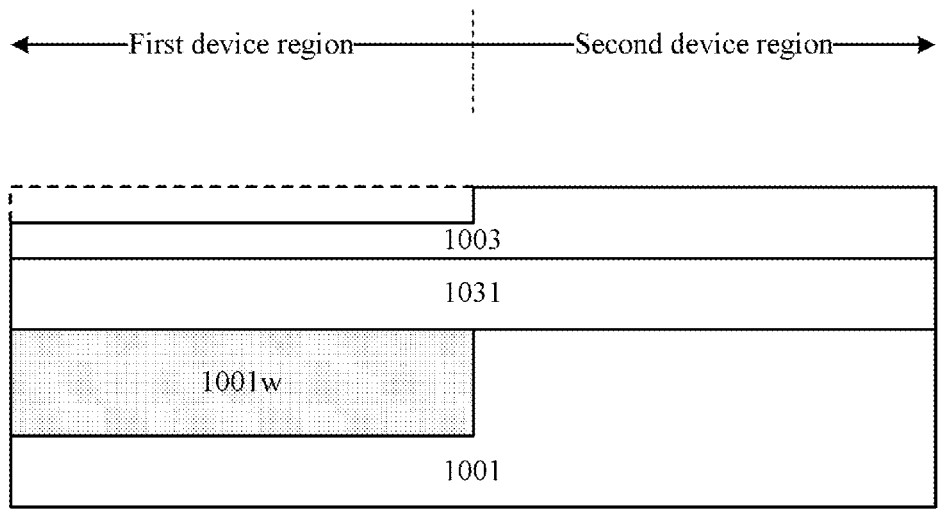
FIGS. 36 and 37 are schematic views showing a process of thinning a channel layer according to an embodiment of the present disclosure.

For example, after the first source/drain layer 1031 and the channel layer 1003 are grown on the substrate 1001 as described above in connection with FIG. 1, the channel layer 1003 may be thinned as shown in FIG. 36. The first source/drain layer 1031 and the channel layer 1003 may be grown in a substantially even way (and therefore have a substantially uniform thickness so that their respective upper and lower surfaces may extend substantially in parallel to the substrate surface). In the first device region, the channel layer 1003 may have its thickness reduced by selective etching, in which case the second device region may be covered (for example, with photoresist). Thus, although the channel layer 1003 continues to extend integrally along a plane parallel to the substrate surface on the substrate 1001, the thickness thereof changes (as some of the top surface thereof is recessed). In order to accurately control the thickness of the channel layer 1003, the etching may include Atomic Layer Etching (ALE).

Figure 37:
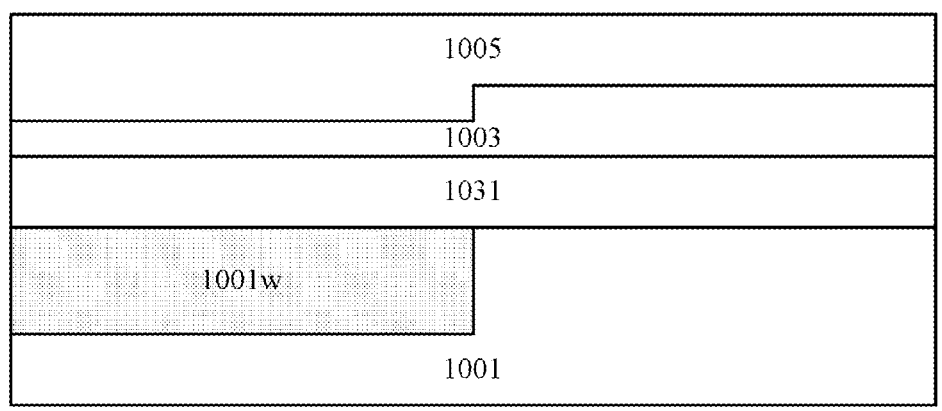

Then, as shown in FIG. 37, the second source/drain layer 1005 may be further grown on the channel layer 1003. With the growth of the second source/drain layer 1005, the difference in thicknesses between the respective device regions may gradually decrease or even eventually disappear (that is, the top surface of the second source/drain layer 1005 is substantially planar and substantially parallel to the substrate surface; or if the second source/drain layer 1005 is relatively thin, there may still be a thickness fluctuation that, however, does not affect subsequent processes.)

Figure 38:
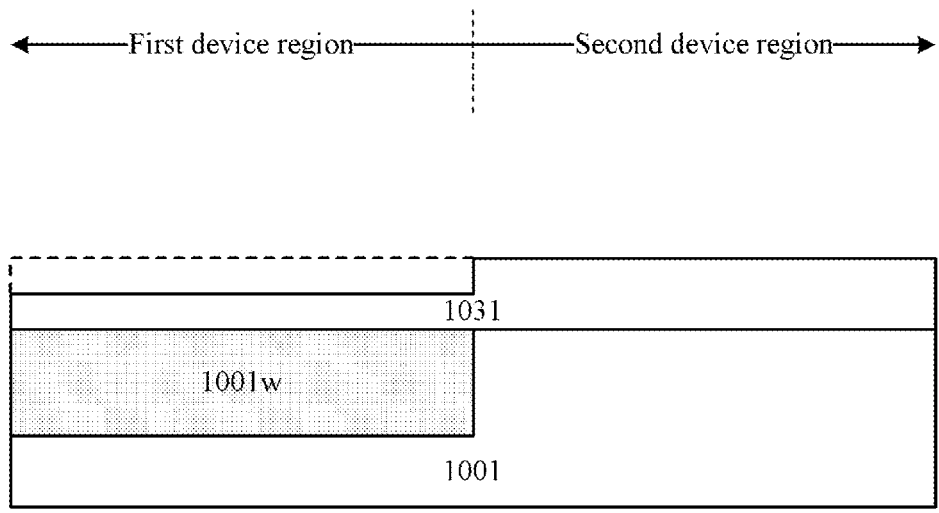
FIGS. 38 and 39 are schematic views showing a process of thinning a source/drain layer according to an embodiment of the present disclosure.

According to another embodiment, after the first source/drain layer 1031 is grown on the substrate 1001 as described above in connection with FIG. 1, the first source/drain layer 1031 may be thinned as shown in FIG. 38. The first source/drain layer 1031 may be grown in a substantially even way (and therefore have a substantially uniform thickness so that its upper and lower surfaces may extend substantially in parallel to the substrate surface). In the first device region, the first source/drain layer 1031 may have its thickness reduced by selective etching, in which case the second device region may be covered (for example, with photoresist).

Figure 39:
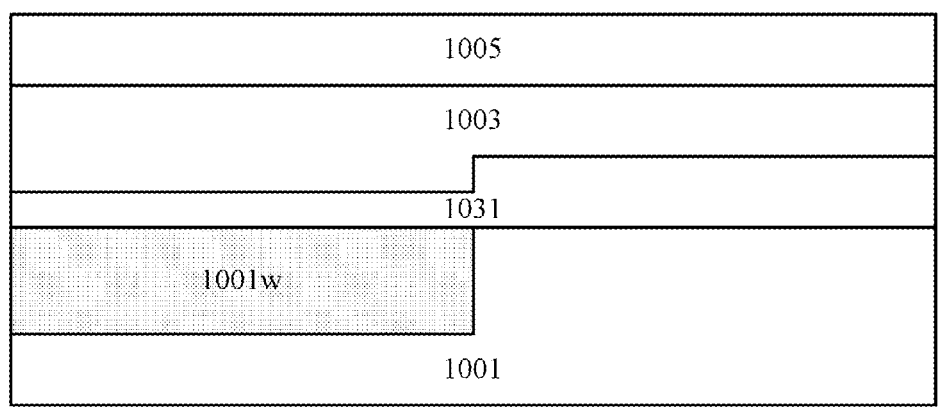

Then, as shown in FIG. 39, the channel layer 1003 may be further grown on the first source/drain layer 1031. With the growth of the channel layer 1003, the difference in thicknesses between the respective device regions may gradually decrease or even eventually disappear (that is, the top surface of the channel layer 1003 is substantially planar and substantially parallel to the substrate surface; or if the channel layer 1003 is relatively thin, there may still be a thickness fluctuation that, however, does not affect subsequent processes.) After that, the second source/drain layer 1005 may be further grown on the channel layer 1003.

The semiconductor device according to the embodiments of the present disclosure is applicable to various electronic devices. For example, an Integrated Circuit (IC) may be formed by integrating a plurality of such semiconductor devices and also other devices (for example, transistors in other forms or the like), from which an electronic device may be made. Therefore, the present disclosure further provides an electronic device comprising the above semiconductor device. The electronic device may also comprise components such as a display operatively coupled to the IC and a wireless transceiver operatively coupled to the IC, or the like. Such an electronic device may comprise, for example, a smart phone, a computer, a tablet Personal Computer (PC), an artificial intelligence device, a wearable device, a mobile power supply, or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

The embodiments of the present disclosure have been described above. However, these embodiments are for illustrative purposes only and are not intended to limit the scope of the present disclosure. The scope of the disclosure is defined by the appended claims and their equivalents. Numerous alternatives and modifications may be made by those skilled in the art without departing from the scope of the present disclosure, and such alternatives and modifications should all fall within the scope of the present disclosure.

I claim:

1. A semiconductor device, comprising:
a substrate;
a first device and a second device formed on the substrate, wherein each of the first device and the second device comprises: a first source/drain layer, a channel layer and a second source/drain layer stacked on the substrate in sequence; and
a gate stack surrounding a periphery of the channel layer, wherein the channel layer of the first device and the channel layer of the second device are substantially co-planar with each other, and at least one of the respective second source/drain layers of the first device and the second device comprises a first semiconductor material and a second semiconductor material that have different compositions from each other to create stress, and the second semiconductor material extends on entire sidewalls of the first semiconductor material, and
wherein the gate stack has an end close to the channel layer, a top surface of the end of the gate stack is substantially coplanar with a top surface of the channel layer, a bottom surface of the end of the gate stack is substantially coplanar with a bottom surface of the channel layer, and at least part of a dielectric layer of a gate is in a "U" shape rotated by 90 degrees.

2. The semiconductor device of claim 1, wherein the created stress is along a current flow direction in the device.

3. The semiconductor device of claim 1, wherein the second source/drain layers of the first device and the second device are configured to create opposite stress.

4. The semiconductor device of claim 1, wherein
the first device is an n-type device, with the stress along a current flow direction therein being tensile stress; and
the second device is a p-type device, with the stress along a current flow direction therein being compressive stress.

5. The semiconductor device of claim 4, further comprising a stress enhancement layer abutting the second semiconductor material and/or the first source/drain layer.

6. The semiconductor device of claim 5, wherein the stress enhancement layer has stress opposite to the created stress.

7. The semiconductor device of claim 1, wherein there is a crystalline interface and/or a doping concentration interface between the first source/drain layer and the channel layer and/or between the channel layer and the second source/drain layer.

8. The semiconductor device of claim 1, wherein the second semiconductor material abuts the channel layer, and wherein the first semiconductor material is formed on the second semiconductor material.

9. The semiconductor device of claim 8, wherein
the first semiconductor material has a lattice constant greater than that of the second semiconductor material in a state of being not strained, to create compressive stress in the channel layer; or
the first semiconductor material has a lattice constant less than that of the second semiconductor material in the state of being not strained, to create tensile stress in the channel layer.

10. The semiconductor device of claim 8, wherein
for a p-type device, the first semiconductor material has a lattice constant greater than that of the second semiconductor material in a state of being not strained, to create compressive stress in the channel layer; or
for an n-type device, the first semiconductor material has a lattice constant less than that of the second semiconductor material in the state of being not strained, to create tensile stress in the channel layer.

11. The semiconductor device of claim 8, wherein
for a p-type device, the first semiconductor material comprises first SiGe, the second semiconductor material comprises second SiGe, wherein the first SiGe has a concentration of Ge greater than that in the second SiGe; or
for an n-type device, the first semiconductor material comprises first SiGe, the second semiconductor material comprises second SiGe, wherein the first SiGe has a concentration of Ge less than that in the second SiGe.

12. The semiconductor device of claim 1, wherein the channel layer of the first device has an upper surface substantially coplanar with that of the channel layer of the second device and/or a lower surface substantially coplanar with that of the channel layer of the second device.

13. The semiconductor device of claim 1, wherein the channel layer of the first device has a thickness different from that of the channel layer of the second device, or the first device has a channel length different from that of the second device.

14. The semiconductor device of claim 1, wherein each of the first device and the second device further comprises:
a gate contact pad laterally extending from a gate conductor layer in the gate stack in a direction away from the channel layer, wherein the gate conductor layer and the corresponding gate contact pad of at least one of the first device and the second device comprise different materials.

15. The semiconductor device of claim 14, wherein the gate contact pads of the first device and the second device comprise the same material.

16. The semiconductor device of claim 14, wherein the gate conductor layer and the corresponding gate contact pad of the other of the first device and the second device comprise the same material and extend integrally.

17. The semiconductor device of claim 14, wherein the first device is an n-type device, the second device is a p-type device, and the gate contact pads of the first device and the second device are connected electrically to each other.

18. The semiconductor device of claim 17, wherein the gate contact pads of the first device and the second device are connected physically and directly to each other.

19. The semiconductor device of claim 17, further comprising a conductive bridge configured to connect the first source/drain layer of the first device and the first source/drain layer of the second device.

20. An electronic device comprising an Integrated Circuit (IC) comprising the semiconductor device of claim 1.

21. The electronic device of claim 20, further comprising a display operatively coupled to the IC and a wireless transceiver operatively coupled to the IC.

22. The electronic device of claim 20, wherein the electronic device comprises a smart phone, a computer, a tablet computer, an artificial intelligence device, a wearable device, or a mobile power supply.

23. A method of manufacturing a semiconductor device, comprising:
disposing a stack of a first source/drain layer, a channel layer, and a second source/drain layer on a substrate;
defining an active region for a first device and an active region for a second device respectively from the first source/drain layer, the channel layer, and the second source/drain layer which are stacked;
forming gate stacks for the first device and the second device to surround peripheries of the respective channel layers in the respective active regions for the first device and the second device; and
creating stress from at least one of the respective second source/drain layers of the first device and the second device by including a first semiconductor material and a second semiconductor material that have different compositions from each other in the at least one of the respective second source/drain layers, and the second semiconductor material extends on entire sidewalls of the first semiconductor material, and
retaining at least part of a dielectric layer of a gate in a "U" shape rotated by 90 degrees.

24. The method of claim 23, wherein the creating the stress comprises:
selectively etching the second source/drain layer which comprises the second semiconductor material to partially remove the second source/drain layer; and
growing the first semiconductor material with a remaining portion of the second source/drain layer as a seed.

25. The method of claim 24, wherein before the growing of the first semiconductor material, the method further comprises:
forming a stress enhancement layer on sidewalls of the second source/drain layer.

26. The method of claim 25, wherein the stress enhancement layer has stress opposite to the created stress.

27. The method of claim 24, further comprising:
forming a mask covering at least portions of the second source/drain layer close to sidewalls thereof, wherein the selective etching of the second source/drain layer is performed using the mask.

28. The method of claim 24, wherein the selective etching comprises atomic layer etching.

29. The method of claim 23, further comprising:
forming respective gate contact pads for the first device and the second device, wherein the gate contact pads extend from respective gate conductor layers in the respective gate stacks in a direction away from the respective channel layers, and wherein the gate conductor layer and the corresponding gate contact pad of at least one of the first device and the second device comprise different materials.

30. The method of claim 29, wherein the gate contact pads are formed from the gate conductor layer of one of the first device and the second device.

31. The method of claim 23, wherein the disposing of the stack comprises:
growing the channel layer evenly on the first source/drain layer; and
thinning the grown channel layer in one of an area for the first device and an area for the second device, or further growing the channel layer in one of the area for the first device and the area for the second device.

32. The method of claim 23, wherein the disposing of the stack comprises:
growing the first source/drain layer evenly on the substrate; and
thinning the grown first source/drain layer in one of an area for the first device and an area for the second device.

33. A semiconductor device, comprising:
a substrate;
a first device and a second device formed on the substrate, wherein each of the first device and the second device comprises: a first source/drain layer, a channel layer and a second source/drain layer stacked on the substrate in sequence; and a gate stack surrounding a periphery of the channel layer, wherein the channel layer of the first device and the channel layer of the second device are substantially co-planar with each other, and at least one of the respective second source/drain layers of the first device and the second device comprises a first semiconductor material and a second semiconductor material that have different compositions from each other to create stress, and the second semiconductor material extends on sidewalls and a bottom of the first semiconductor material, and wherein the gate stack has an end close to the channel layer, a top surface of the end of the gate stack is substantially coplanar with a top surface of the channel layer, a bottom surface of the end of the gate stack is substantially coplanar with a bottom surface of the channel layer, and at least part of a dielectric layer of a gate is in a "U" shape rotated by 90 degrees.

* * * * *